(12) United States Patent  (10) Patent No.: US 9,825,205 B2
Haley et al.  (45) Date of Patent: Nov. 21, 2017

(54) QUANTUM DOT (QD) POLYMER COMPOSITES FOR ON-CHIP LIGHT EMITTING DIODE (LED) APPLICATIONS

(71) Applicant: Pacific Light Technologies Corp., Portland, OR (US)

(72) Inventors: Kari N. Haley, Portland, OR (US); Benjamin Daniel Mangum, Tualatin, OR (US); Weiwen Zhao, Happy Valley, OR (US); Nathan Evan Stott, West Linn, OR (US); Juanita N. Kurtin, Hillsboro, OR (US)

(73) Assignee: Pacific Light Technologies Corp., Portland, OR (US)

( * ) Notice: Subject to any disclaimer, the term of this patent is extended or adjusted under 35 U.S.C. 154(b) by 0 days.

(21) Appl. No.: 14/196,150

(22) Filed: Mar. 4, 2014

(65) Prior Publication Data

US 2015/0203747 A1   Jul. 23, 2015

Related U.S. Application Data

(60) Provisional application No. 61/928,561, filed on Jan. 17, 2014.

(51) Int. Cl.
*H01L 33/00* (2010.01)
*H01L 33/50* (2010.01)
*B82Y 20/00* (2011.01)

(52) U.S. Cl.
CPC ............ *H01L 33/502* (2013.01); *B82Y 20/00* (2013.01); *H01L 33/501* (2013.01); *H01L 2933/0041* (2013.01); *Y10S 977/779* (2013.01); *Y10S 977/95* (2013.01)

(58) Field of Classification Search
CPC ..... H01L 2933/0058; H01L 2933/0025; H01L 2933/0033; H01L 33/38; H01L 33/005; H01L 33/60; H01L 33/0079; H01L 33/405; H01L 33/46; H01L 33/56; H01L 33/502; H01L 33/501; C09K 11/04
USPC ..................................... 257/98–100
See application file for complete search history.

(56) References Cited

U.S. PATENT DOCUMENTS

2010/0276638 A1\* 11/2010 Liu .................. B82Y 30/00
252/301.35

\* cited by examiner

*Primary Examiner* — Hoa B Trinh
(74) *Attorney, Agent, or Firm* — Elliott, Ostrander & Preston, P.C.

(57) ABSTRACT

Quantum dot polymer composites for on-chip light emitting diode applications are described. In an example, a composite for on-chip light emitting diode application includes a polymer matrix, a plurality of quantum dots dispersed in the polymer matrix, and a base dispersed in the polymer matrix.

10 Claims, 17 Drawing Sheets

WHITE LIGHT

QUANTUM DOT (QD) POLYMER COMPOSITES FOR ON-CHIP LIGHT EMITTING DIODE (LED) APPLICATIONS

CROSS-REFERENCE TO RELATED APPLICATIONS

This application claims the benefit of U.S. Provisional Application No. 61/928,561, filed Jan. 17, 2014, the entire contents of which are hereby incorporated by reference herein.

TECHNICAL FIELD

Embodiments of the present invention are in the field of quantum dots and, in particular, quantum dot polymer composites for on-chip light emitting diode applications.

BACKGROUND

Quantum dots having a high photoluminescence quantum yield (PLQY) may be applicable as down-converting materials in down-converting nano-composites used in solid state lighting applications. Down-converting materials are used to improve the performance, efficiency and color choice in lighting applications, particularly light emitting diodes (LEDs). In such applications, quantum dots absorb light of a particular first (available or selected) wavelength, usually blue, and then emit light at a second wavelength, usually red or green.

SUMMARY

Embodiments of the present invention include quantum dot polymer composites for on-chip light emitting diode applications.

In an embodiment, a composite for on-chip light emitting diode application includes a polymer matrix, a plurality of quantum dots dispersed in the polymer matrix, and a base dispersed in the polymer matrix.

In an embodiment, a method of fabricating a composite for on-chip light emitting diode application involves adding a base to a plurality of quantum dots to form a mixture comprising at least a remainder portion of the base. The method also involves adding the mixture to a polymer matrix.

In an embodiment, a method of fabricating a composite for on-chip light emitting diode application involves forming a mixture of a plurality of quantum dots and a first component of a two-part silicone formulation. The method also involves heating the mixture. The method also involves, subsequent to heating the mixture, adding the mixture to a second component of the two-part silicone formulation.

In an embodiment, a method of fabricating a composite for on-chip light emitting diode application involves forming a solution of a plurality of quantum dots in a first solvent. The method also involves removing the first solvent and redissolving the plurality of quantum dots in a second, different, solvent. The method also involves, subsequent to redissolving the plurality of quantum dots in the second solvent, dispersing the plurality of quantum dots in a polymer matrix.

DETAILED DESCRIPTION

Figure 1A:
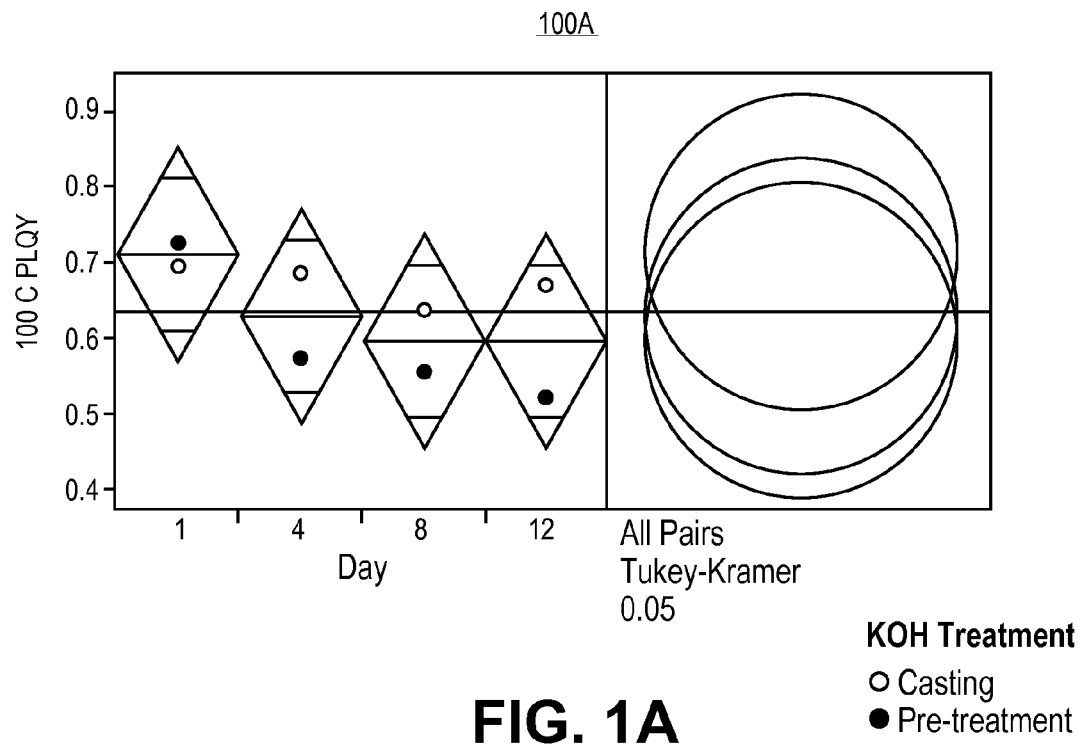
FIG. 1A is a graph showing one-way analysis of quantum dot samples over the course of twelve days for quantum dots delivered as a vinyl-containing poly(phenylmethylsiloxane) polymer solution, in accordance with an embodiment of the present invention.

Quantum dot polymer composites for on-chip light emitting diode applications are described herein. In the following description, numerous specific details are set forth, such as specific quantum dot geometries and efficiencies, in order to provide a thorough understanding of embodiments of the present invention. It will be apparent to one skilled in the art that embodiments of the present invention may be practiced without these specific details. In other instances, well-known related apparatuses, such as the host of varieties of applicable light emitting diodes (LEDs), are not described in detail in order to not unnecessarily obscure embodiments of the present invention. Furthermore, it is to be understood that the various embodiments shown in the figures are illustrative representations and are not necessarily drawn to scale.

One or more embodiments described herein are directed to improved composites including dispersions of quantum dot materials in a polymer matrix for on-chip light emitting diode (LED) applications. In one such embodiment, a composite is formed from a mixture of quantum dots, one or more polymers (e.g., silicone-based polymers) and various additives. The improved composites may exhibit thermal stability, high temperature reliability, and/or high humidity reliability, all of which can be required for good performance in an LED package.

More specifically, in an embodiment, certain components of a polymer composite must be present in order to satisfy the requirements of an on-chip LED down-converter: the quantum dot and an optically clear polymer, preferably a silicone must be present. In the case of quantum dots, ideally the individual particles are separated from each other such that inter-particle interactions are minimized. This requires methods of physically spacing the quantum dots within the polymer. Consequently, methods to reduce quantum dot mobility within the polymer matrix further contribute to enhanced optical performance. Finally, additional additives that act to scatter the excitation light also contribute to improved optical performance and long term stability of the quantum dots.

To provide context, simple dispersions where quantum dots are added and/or mixed into polymer materials typically offer insufficient protection to the quantum dot material from harmful environmental conditions such as oxygen and or moisture. For example, other approaches have involved addition of physical barriers to the outside of a polymer composite in an attempt to prevent moisture ingress, changing the identity of the polymer in an attempt to promote better optical performance from quantum dot (QD) materials, and changing the surface passivation layer which lies between the semiconductor particle and the polymer. However, such approaches have proven to have their limitations on ultimate performance of a composite for LED applications.

In accordance with one or more embodiments described herein, such issues are addressed through a range of coatings, treatments and additives that collectively serve to immobilize quantum dots in a polymer matrix while keeping them physically separated and at least somewhat protected from harmful environmental agents. In an embodiment, such treatments and additives extend one or more of the following benefits to the quantum dots: greater thermal stability, moisture resistance, improved optical performance, and improved optical stability at high temperatures.

Prior to describing additional details on polymer matrix compositions for LED application, in a broader context, delivery and storage of quantum dots prior to actual dispersion in such polymer matrix composites is addressed below. For example, one or more embodiments described herein are directed to approaches for delivering stable quantum dot materials for processing into matrix materials without difficulty and without changing the properties of the quantum dots themselves. Several different approaches for quantum dot or nano-particle delivery are described herein. To provide context, quantum dots are synthesized colloidally and, after purifying with excess reagents, are typically stored in an organic solvent such as toluene. Often, when quantum dots are manufactured for commercial purposes they are delivered as a colloidal suspension in the organic solvent. However, delivering quantum dots in a solvent to end-users who wish to further process the quantum dots into a matrix may be problematic for several reasons. First, quantum dots often require the presence of ligands on the quantum dot surfaces for maintaining the optical properties and structural integrity of the quantum dots. However, the ligands present on the quantum dot surfaces can diffuse in a solvent and, as such, the properties of quantum dots may change over time if stored in this way, whether the storage is at a manufacturing facility or an end-user facility. Second, end-users may prefer not to handle the solvents typically used for storage of quantum dots, such as toluene, due to the significant fire and health hazards and the general trend toward reducing volatile organic compounds in industrial settings. Third, the presence of even trace amounts of a carrier solvent may negatively impact the curing properties of a final quantum dot composite, for example, if the final matrix material is a polymer. Fourth, quantum dots stored in solvent may have a short shelf-life since the particles typically have a higher tendency to irreversibly agglomerate and therefore change properties over time. It is to be appreciated that, conventionally, quantum dots are typically shipped in solution (e.g., as suspended in an organic solvent or water) or as a powder.

To address the above issues, in accordance with one or more embodiments of the present invention, alternative approaches for delivering stable quantum dot materials are described herein. Such approaches may enable further processing of the delivered quantum dot material into a final matrix material without difficulty and without changing the properties of the quantum dots themselves. In at least one such embodiment, quantum dot performance for quantum dots delivered by approaches described herein was unchanged as compared to analogous quantum dots stored in a solvent.

In a first storage or delivery aspect, some embodiments involve delivery methods compatible for an end-use that ultimately involves mixing quantum dots into a silicone polymer. In one such embodiment, quantum dots are delivered as dispersed in a polymer bearing the same functional groups as standard light emitting diode (LED) polymer encapsulants, enabling elimination of the use of an organic solvent as a dispersant while ensuring compatibility between the carrier and LED polymers. In another embodiment, quantum dots are delivered in one part of a two-part silicone formulation, again enabling elimination of the use of an organic solvent as a dispersant. In an embodiment, in either case, a permanent or end-user composite having a dispersion of the nano-particles or quantum dots therein may be fabricated. In another embodiment, in either case, additives to benefit the performance of quantum dots are be added to the quantum dot mixture for shipping, or at the point of mixing/curing/formation of the final end-user composite.

In an exemplary embodiment, a vinyl-terminated poly (phenylmethylsiloxane) (the most preferred PMV-9925) is used as a dispersion medium for delivering quantum dots to a final polymer composite which would comprise a vinyl-terminated poly(phenylmethylsiloxane)-QD and methyl or phenyl-based silicone mixture. In a specific embodiment, solvent was removed from quantum dots and the quantum dots (QD) were re-dispersed into PMV-9925. In a specific embodiment, a strong base (e.g., KOH) is added to the vinyl-terminated poly(phenylmethylsiloxane)-QD mix. The vinyl-terminated poly(phenylmethylsiloxane)-QD mix containing a strong base (e.g. KOH) were then added to a phenyl-based silicone (at a preferred weight ratio of 1:5 QD mixture: silicone) The resulting mixture was cured and then tested for performance (e.g., by measurement of photoluminescent quantum yield, PLQY). The measurements were made at both room temperature and 100 degrees Celsius. The silicone/PMV samples were prepared and tested from the same PMV/QD stock solution over the course of 12 days, and no significant change in performance was observed.

FIG. 1A is a graph 100A showing one-way analysis of quantum dot samples over the course of twelve days for quantum dots delivered as a PMV-9925 solution, in accordance with an embodiment of the present invention. Referring to graph 100A, quantum dot samples were treated with base (KOH) in two manners: prior to dispersing in PMV-9925 and after dispersing in PMV-9925 on the day of film casting. Samples dispersed in PMV-9925 and treated with base on the day of film casting show no significant change in performance at 100 degrees Celsius.

Figure 1B:
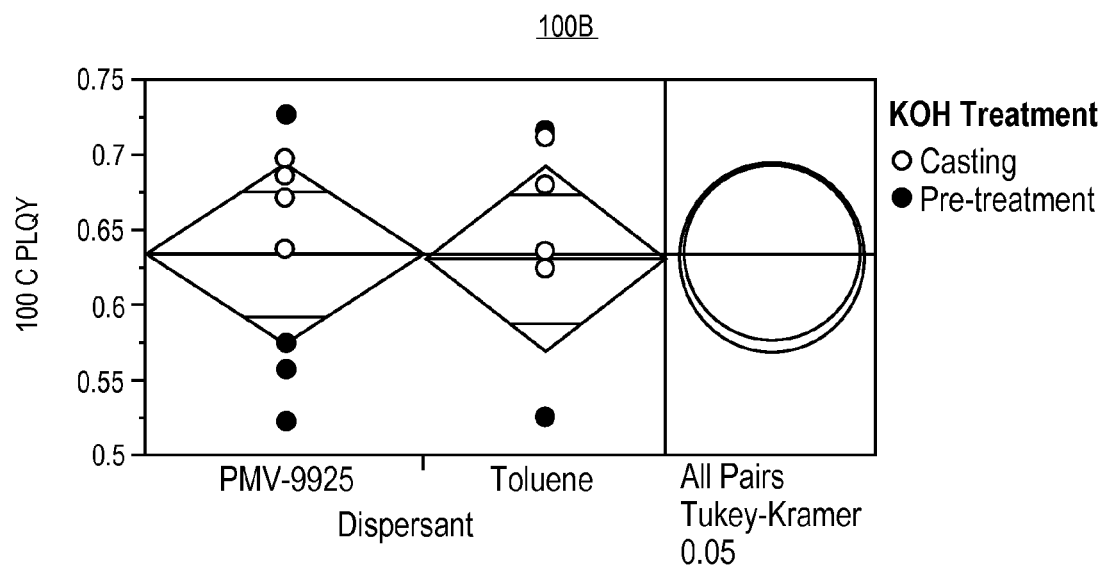
FIG. 1B is a graph showing one-way analysis of quantum dot samples dispersed in two different media: a solvent (toluene) and a vinyl-containing poly(phenylmethylsiloxane) polymer, in accordance with an embodiment of the present invention.

FIG. 1B is a graph 100B showing one-way analysis of quantum dot samples dispersed in two different media: a solvent (toluene) and a polymer (PMV-9925), in accordance with an embodiment of the present invention. Referring to graph 100B, there is no significant different between the two media in relationship to their performance at 100 degrees Celsius. Thus, a performance comparison between quantum dots delivered in solvent (e.g., toluene in this case) and quantum dots delivered in PMV exhibit no statistical difference in PLQY.

In a second storage or delivery aspect, other embodiments involve drying the quantum dots for delivery. In an exemplary embodiment, a plurality of quantum dots is prepared as a powder by a freeze-drying process, also known as lyophilization, which involves removal of an organic solvent by applying vacuum to a solid state dispersion of quantum dots. In one such embodiment, the solid state dispersion is obtained by freezing to a temperature below the melting point of the solvent. In another exemplary embodiment, a plurality of quantum dots is prepared as a powder by removal of a solvent from a quantum dot dispersion using a rotary evaporator or a distillation apparatus followed by complete removal of any residual solvent retained in the solid mass of quantum dot particles. In one such embodiment, the residual solvent is removed by purging using an inert gas such as nitrogen ($N_2$) while the quantum dot particles are exposed to temperatures approximately in the range of 60 to 150 degrees Celsius. In an embodiment, whether dried by lyophilization or by purging with an inert gas, additives to benefit the performance of the quantum dots can be added to the quantum dot mixture for shipping, or at the point of mixing/curing/formation of the final end-user composite (which may include a dispersion of the nano-particles or quantum dots therein). It is to be appreciated that other drying approaches may also be used to prepare quantum dots for delivery.

Figure 2A:
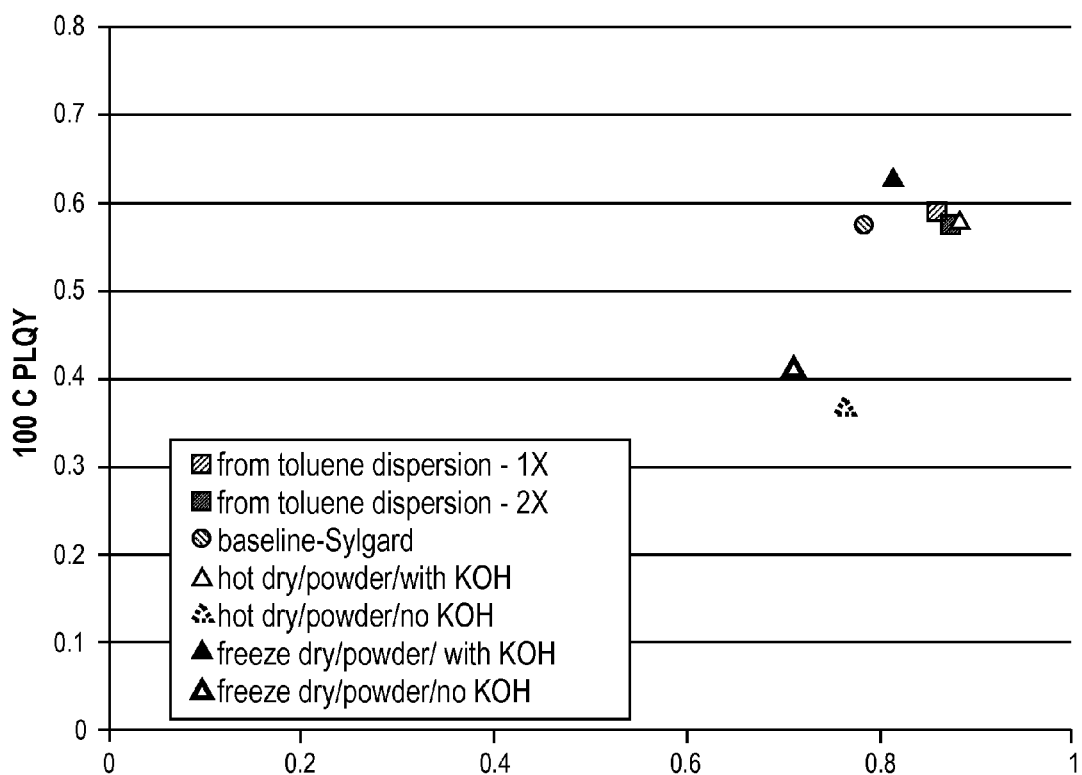
FIG. 2A is a plot of PLQY at 100 degrees Celsius versus room temperature showing luminescent nano-composite performance of films including quantum dots, in accordance with an embodiment of the present invention.

In accordance with an exemplary embodiment, FIG. 2A is a plot 200A of PLQY at 100 degrees Celsius versus room temperature showing luminescent nano-composite performance of films including quantum dots. Referring to plot 200A, films were prepared with light emitting diode (LED)-grade silicones to which quantum dot (QD) particles were incorporated by mixing with a toluene dispersion of the QD, QDs dried with heat, and QDs dried at low temperatures. Samples prepared from particles in toluene and particles which were dried in two different ways performed comparably. Any difference in performance observed here may arise from using a base (e.g., KOH in this case) as an additive to boost the photoluminescence quantum yield (PLQY), and not from the drying protocol. It is to be appreciated that based addition other than KOH may be used to boost PLQY.

Figure 2B:
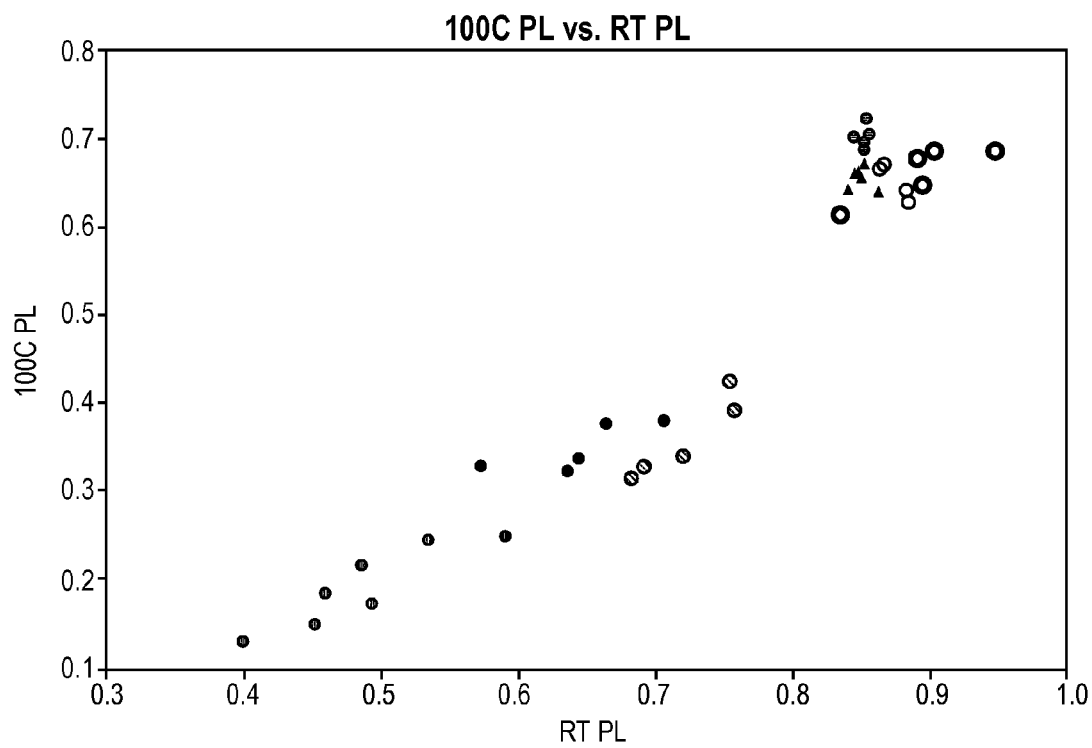
FIG. 2B is a plot of PLQY at 100 degrees Celsius versus room temperature showing luminescent nano-composite performance of films including quantum dots, in accordance with an embodiment of the present invention.

In accordance with another exemplary embodiment, FIG. 2B is a plot 200B of PLQY at 100 degrees Celsius versus room temperature showing luminescent nano-composite performance of films including quantum dots. Referring to plot 200B, luminescent nano-composite performance is provided for films prepared with LED grade silicones to which QD particles (open dots) were incorporated by mixing with a toluene dispersion of the QDs or with freeze-dried QDs at different concentrations, along with a base. The solid dots represent performance of nano-composites prepared with freeze-dried particles but to which KOH was not added. A very similar trend is observed for films prepared with particles from toluene dispersions. It is to be appreciated that based addition other than KOH may be used to boost PLQY.

Figure 3A:
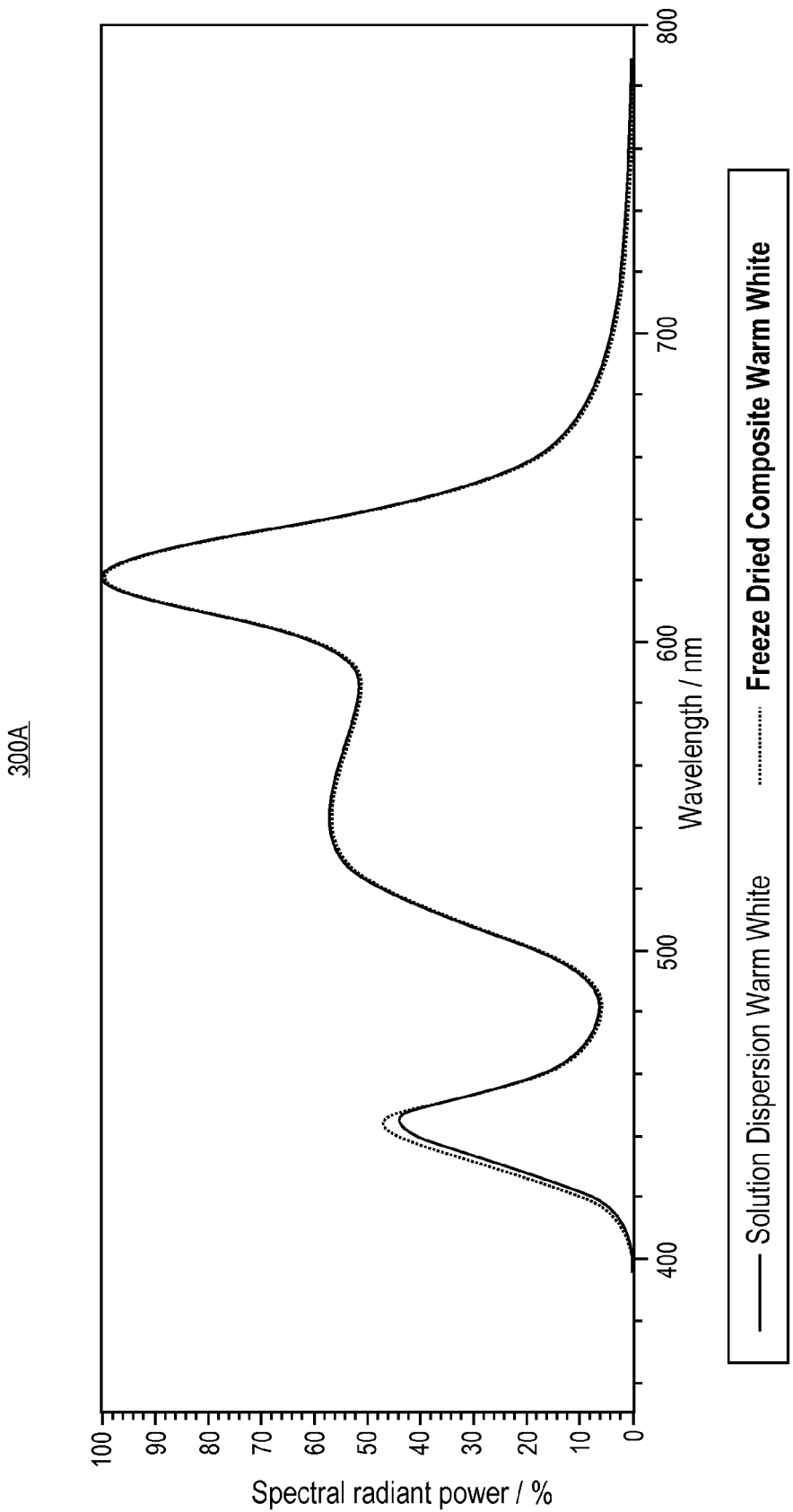
FIG. 3A is a plot of spectral radiant power (%) as a function of wavelength (nm) comparing performance of freeze-dried quantum dot heterostructures (QDH) along with solution dispersion QDH in the fabrication of a warm white phosphor film, in accordance with an embodiment of the present invention.
Figure 3B:
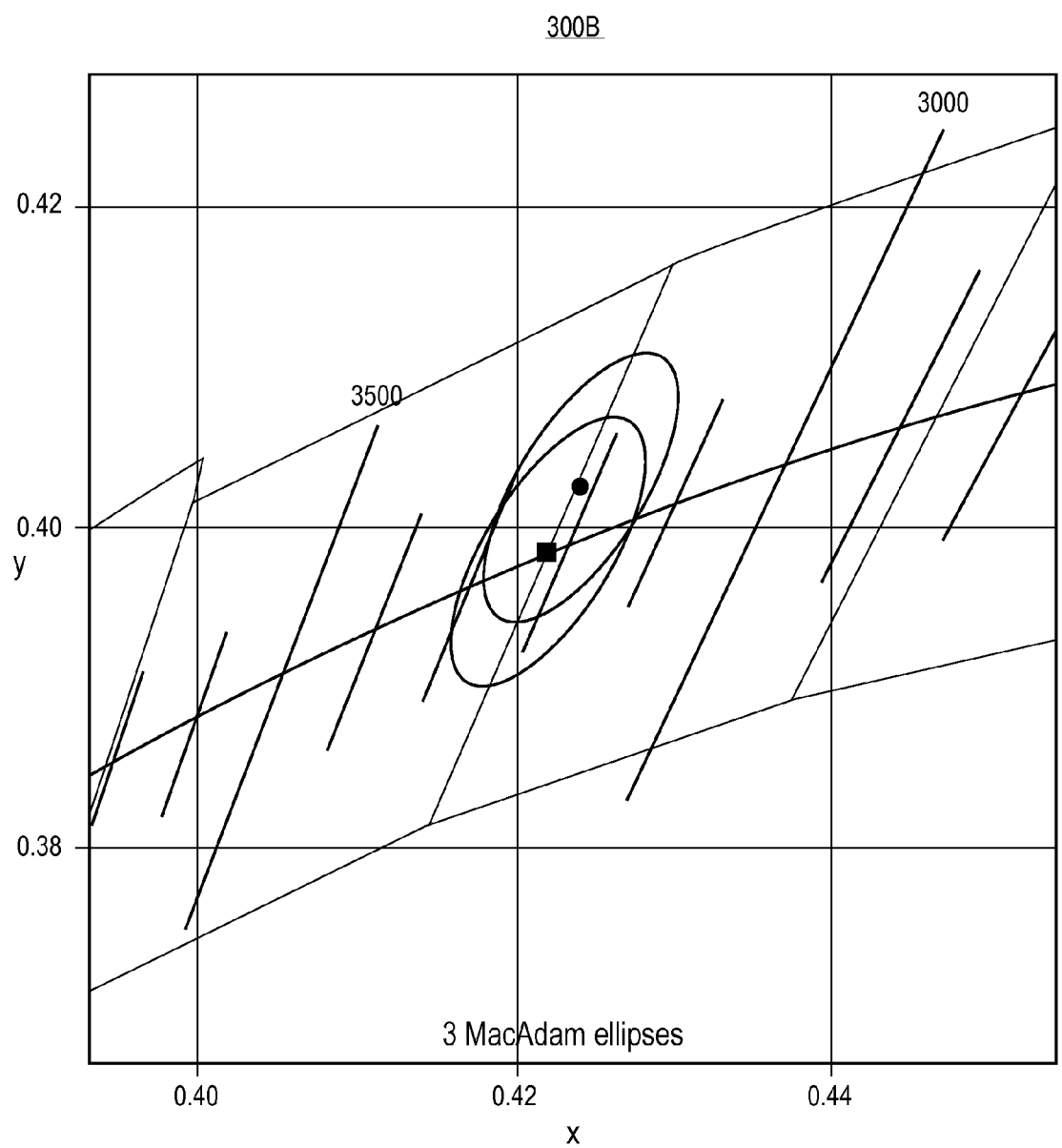
FIG. 3B is a CIE 1931 plot of freeze-dried warm white film (square) compared to solution dispersion warm white film (circle), in accordance with an embodiment of the present invention.

In accordance with another exemplary embodiment, FIG. 3A is a plot 300A of spectral radiant power (%) as a function of wavelength (nm) comparing performance of freeze-dried quantum dot heterostructures (QDH) along with solution dispersion QDH in the fabrication of a warm white phosphor film. Referring to plot 300A, the freeze-dried approach maintains the same color quality and color rendering as compared to the solution dispersion method. Plot 300A also reveals that the freeze-dried nano-powder and the green phosphor powder do not aggregate together in the matrix which would otherwise be detrimental to performance. In accordance with another exemplary embodiment, FIG. 3B is a CIE 1931 plot 300B of freeze-dried warm white film (square) compared to solution dispersion warm white film (circle). Referring to plot 300B, both approaches provide results that are within a 3-step MacAdam ellipse.

In another aspect, whether or not implementing the above described storage and delivery approaches, one or more embodiments described herein are directed to quantum dot polymer composites for on-chip light emitting diode applications. In one such embodiment, a principal strategy involves coating a plurality of nano-particles (such as a plurality of quantum dots) with a layer of silica ($SiO_2$), titania ($TiO_2$), or similar insulator coating (shell). Following completion of such a shelling reaction, the particles are further treated accordingly to one or more (in any suitable combination) of the approaches described below.

In a first approach pertaining to embodiments involving the fabrication of quantum dot polymer composites for on-chip light emitting diode applications, a plurality of quantum dots is subjected to a base pre-treatment. For example, in an embodiment, the addition of base (caustic) is beneficial for quantum dot materials. The base addition can be accomplished in several ways: (1) as a pre-treatment, where the nano-particles are treated with base prior to the addition of the nano-articles to a final polymer composite, or (2) the base can be added directly in a manner such that it remains in the final polymer. Regarding pre-treatment approaches, the base can be added for the pre-treatment in several ways: (a) in a first embodiment, the base is added directly to a concentrated quantum dot stock solution in solvent, (b) in a second embodiment, the base is added to the quantum dots following removal of solvent, (c) in a third embodiment, the base is added to a diluted solution of quantum dots, and (d) in s fourth embodiment the base is added to a slurry of QDs in polymer, the base treated slurry can be optimally heated (for further solvent removal/improved performance) Furthermore, it is to be appreciated that the above variations of base pretreatment may be accompanied by the addition of additives, as described in greater detail below.

In an exemplary, high performance embodiment, a base is added to a dilute solution of quantum dots. Suitable bases include, but are not limited to, lithium hydroxide (LiOH), potassium hydroxide (KOH), sodium hydroxide (NaOH), rubidium hydroxide (RbOH), cesium hydroxide (CsOH), magnesium hydroxide ($Mg(OH)_2$), calcium hydroxide ($Ca(OH)_2$), strontium hydroxide ($Sr(OH)_2$), barium hydroxide ($Ba(OH)_2$), tetramethylammonium hydroxide ($(Me)_4NOH$), tetraethylammonium hydroxide ($(Et)_4NOH$), tetrabutylammonium hydroxide ($(Bu)_4NOH$)), or combinations thereof. Additionally, organic bases have also shown promise and can be useful when the use of a strong caustic is not desired. Examples include lithium diisopropyl amide (LDA), sodium bis(trimethylsilyl)amide (sodium HMDS), and potassium bis(trimethylsilyl)amide (potassium HMDS). The quantum dot material is treated with the base prior to addition to a polymer mixture. This approach allows for the removal of excess or un-reacted base from the film making process, ensuring that the polymer does not degrade from the reaction of base with silicone. Thus, in accordance with a specific embodiment, the above exemplary approach enables treatment with an excess of base to ensure that optimal pre-treatment conditions have been achieved. For example, the amount of base used is typically far greater when used as a pre-treatment compared to adding the base to the polymer directly. However, the approach leaves room for removal of any base prior to polymer incorporation.

Comparison of a pre-treatment protocol and a leave-in protocol can be made by comparing Experiments 1 and 2, respectively, in the Experimental Section provided below. Acid-base titrations have been performed on the discarded supernatants from each operation of the pre-treatment to determine the amount of base that remains in the polymer. From this procedure, it has determined that approximately 25% of the base added remains or, in other words, the amount of base left in place after each process is roughly equal. Experiment 3 in the Experimental Section provided below represents a suitable base pre-treatment protocol.

In a second approach pertaining to embodiments involving the fabrication of quantum dot polymer composites for on-chip light emitting diode applications, a plurality of quantum dots is subjected to a heat treatment. The heat treatment may be of the quantum dots, the quantum dots including an additive, or the quantum dots including an additive and a polymer. In a exemplary embodiment, a mixture of quantum dots and any additives (including base) is treated with heat in one part of a two-part silicone polymer prior to curing in order to improve ultimate composite performance. In one such embodiment, the heat treatment is performed in a portion of a polymer that includes silicon-hydride species.

A heat treatment may be applied with or without the presence of a base. When the treatment is performed without base, quantum dots exhibit noticeable aggregation of dots in the polymer. By contrast, heat treatment in the presence of a base results in noticeably less aggregation and/or condensation of the silica shell surrounding the QDs. Suitable bases include, but are not limited to, LiOH, KOH, NaOH, RbOH, CsOH, $Mg(OH)_2$, $Ca(OH)_2$, $Sr(OH)_2$, $Ba(OH)_2$, $(Me)_4NOH$, $(Et)_4NOH$, $(Bu)_4NOH$, or combinations thereof. Although not to be bound by theory, it is believed that for quantum dots coated with a silica shell, the heat treatment process serves to further the condensation of the silica shell from unreacted hydroxyl (silanol) groups. The condensation is in effect a densification of the shell that provides to a protective barrier that is less permeable to oxygen and moisture. Along with shell densification, it has been observed that the presence of base prevents the extreme aggregation of particles that would otherwise take place at high temperatures, potentially by forming bonds between the polymer and the silica. In other embodiment, the heat treatment is instead performed in another high-boiling point solvent or polymer. Such embodiments may involve using as a base directly in reaction, or simply as residual base left in the quantum dot materials following a pre-treatment.

Figure 4A:
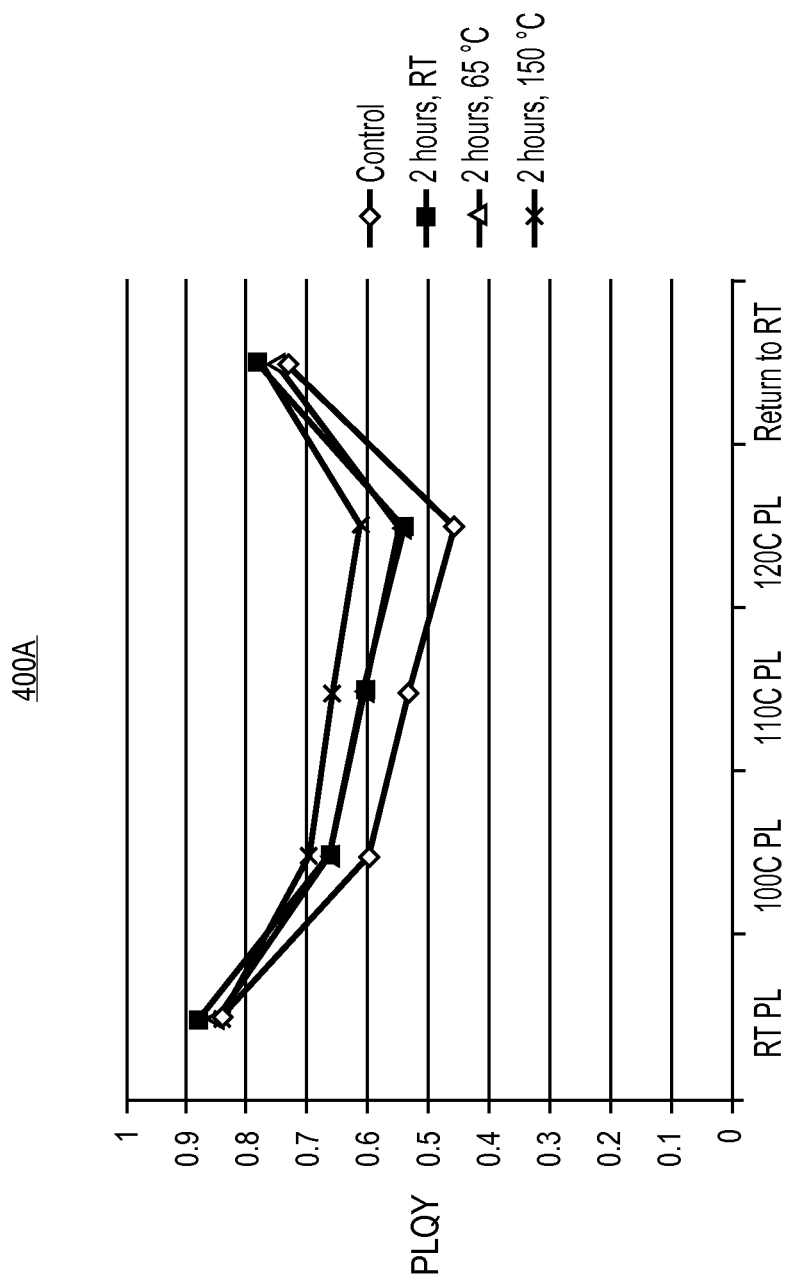
FIG. 4A is a graph showing the temperature test results for a sample set where the quantum dot heterostructure (QDH)/polymer solution was treated for the same amount of time at different temperatures, in accordance with an embodiment of the present invention.

In an exemplary heat treatment in the presence of a base, quantum dots having an associated solvent removed are then mixed into a non-catalyst containing polymer component. A base, such as one or more of the above listed bases, is added and the solution is mixed again. The vial is placed in an approximately 150° C. oven for a duration approximately in the range of 2 hours, or until any bubbling is completed. The solution is allowed to cool to room temperature and the polymer component with catalyst is added to the solution and mixed thoroughly. The treatment allows the base to react more completely with the quantum dots, instead of the polymer, maintaining or even enhancing the quantum dot performance at high temperatures. FIG. 4A is a graph 400A showing the temperature test results for a sample set where the quantum dot heterostructure (QDH)/polymer solution was treated for the same amount of time at different temperatures, in accordance with an embodiment of the present invention. Referring to graph 400A, there is an increase in PLQY at the higher temperatures for the samples that underwent the heat treatment versus the control (non-heat treated) samples.

Figure 4B:
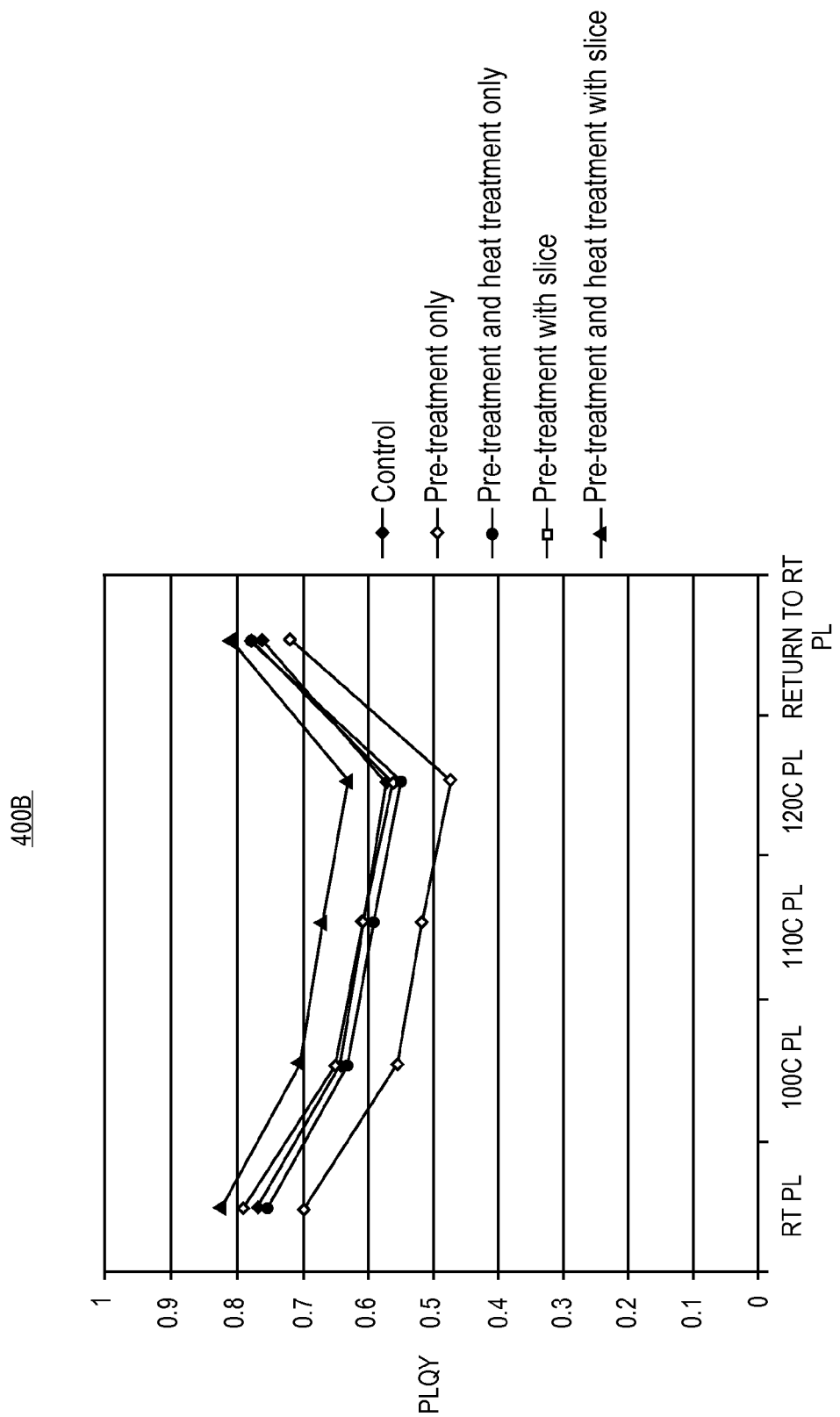
FIG. 4B is a graph showing the temperature test results for a sample set, including free silica containing samples, where the quantum dot heterostructure (QDH)/polymer solution was treated for the same amount of time at different temperatures, in accordance with an embodiment of the present invention.

The above described heat treatment approach may also enable ready incorporation of free powders, such as silica, alumina, titania, or magnesium oxide, into the composite films. In an exemplary embodiment, free silica (e.g., nano-powder or other) is weighed out into a vial and the QDH stock solution is added to the vial and mixed well. The solvent is removed and the residual silica/QDH mixture is dispersed in a silicone fluid, usually the non-catalyst containing component of a silicone polymer mixture (but it is to be appreciated that a non-functional silicone fluid may also be used). The solution is mixed well, base is added, and the solution is again mixed thoroughly. The vial is then placed in an approximately 150° C. oven until the visual signs (e.g., bubbling) of the reaction of the base with the QDH and silica are completed. The solution is allowed to cool to room temperature, the vinyl-containing polymer component is mixed in, and films are cast. FIG. 4B is a graph 400B showing the temperature test results for a sample set, including free silica containing samples, where the quantum dot heterostructure (QDH)/polymer solution was treated for the same amount of time at different temperatures, in accordance with an embodiment of the present invention. Referring to graph 400B, the best performance is obtained for samples having a base pre-treatment, a heat treatment, and added free silica.

In a third approach pertaining to embodiments involving the fabrication of quantum dot polymer composites for on-chip light emitting diode applications, a plurality of quantum dots is subjected to use of other solvents (e.g., DMSO, xylene) for dispersion of the quantum dots in a polymer. For example, in an embodiment, changing the dispersion characteristics of a plurality of quantum dots by using a solvent different from the solvent used for synthesis can increase the performance of the quantum dots in the final composite films. In one such embodiment, dimethyl sulfoxide (DMSO) is used as a solvent to change the characteristics of a quantum dot stock solution. By comparison, when toluene is used (which is typically used as the synthetic solvent), the quantum dots have a tendency to stick to the glass vial. However, when the quantum dots are later dispersed in DMSO, the same does not occur to the same extent. DMSO also has the potential to greatly increase the efficacy of the base treatment of the quantum dots prior to placing in the polymer matrix. Furthermore, in an embodiment, DMSO maintains the solubility of the quantum dots upon the addition of large excesses of base, at least up to 12 times the amount added to the standard process.

In a fourth approach pertaining to embodiments involving the fabrication of quantum dot polymer composites for on-chip light emitting diode applications, a plurality of quantum dots is subjected to use of dehydrogenative coupling catalysts. In an exemplary embodiment, since quantum dots coated with a shell of silica have many silanol groups on the surface available for reaction, one method of covalently bonding the silica shelled quantum dots into the polymer is through the use of dehydrogenative coupling reactions. The reaction typically involves a reactive hydride and a silanol, in which a covalent siloxane bond (—Si—O—Si—) is formed and hydrogen is liberated as a reaction product. The reaction can be catalyzed by dibutyl tin, zinc octoate, zirconium octaote, etc. Such catalysts may be beneficial to silica shells in that they can serve to promote densification of the shell by catalyzing the reaction between a silanol group on the silica shell and another group either on the silica shell, in the polymer matrix, or with some other additive. In a specific such embodiment, tin is used as the catalyst. However, tin catalysts may poison a platinum catalyst used in a subsequent polymer curing step. Accordingly, in other embodiments, treatments with either zinc octoate, zirconium octoate, or other metal (Ca, Co, etc.) octoate catalysts can be used to provide improved quantum yields at high temperatures.

In a fifth approach pertaining to embodiments involving the fabrication of quantum dot polymer composites for on-chip light emitting diode applications, a plurality of quantum dots is subjected to surface functionalization. In an exemplary embodiment, the surface of silica-shelled quantum dots is further reacted to improve incorporation into polymers, to reduce aggregation, and/or to provide improved environmental protection. In one such embodiment, using a reactive vinyl terminated orthosilicate compound, such as VMES, a layer is added around the silica shelled materials such that vinyl groups extend from the shells. The resulting materials behave differently from comparable quantum dot materials having no vinyl groups in that the vinyl-group-terminated samples do not stick to glass and incorporate readily into other polymers. Thus, improved storage and handling conditions may be provided, while minimizing material losses. In an embodiment, the vinyl groups are further reacted with hydrides present in OE6630 B via a standard platinum catalyzed addition reaction that is already occurs between parts A and B.

Figure 4C:
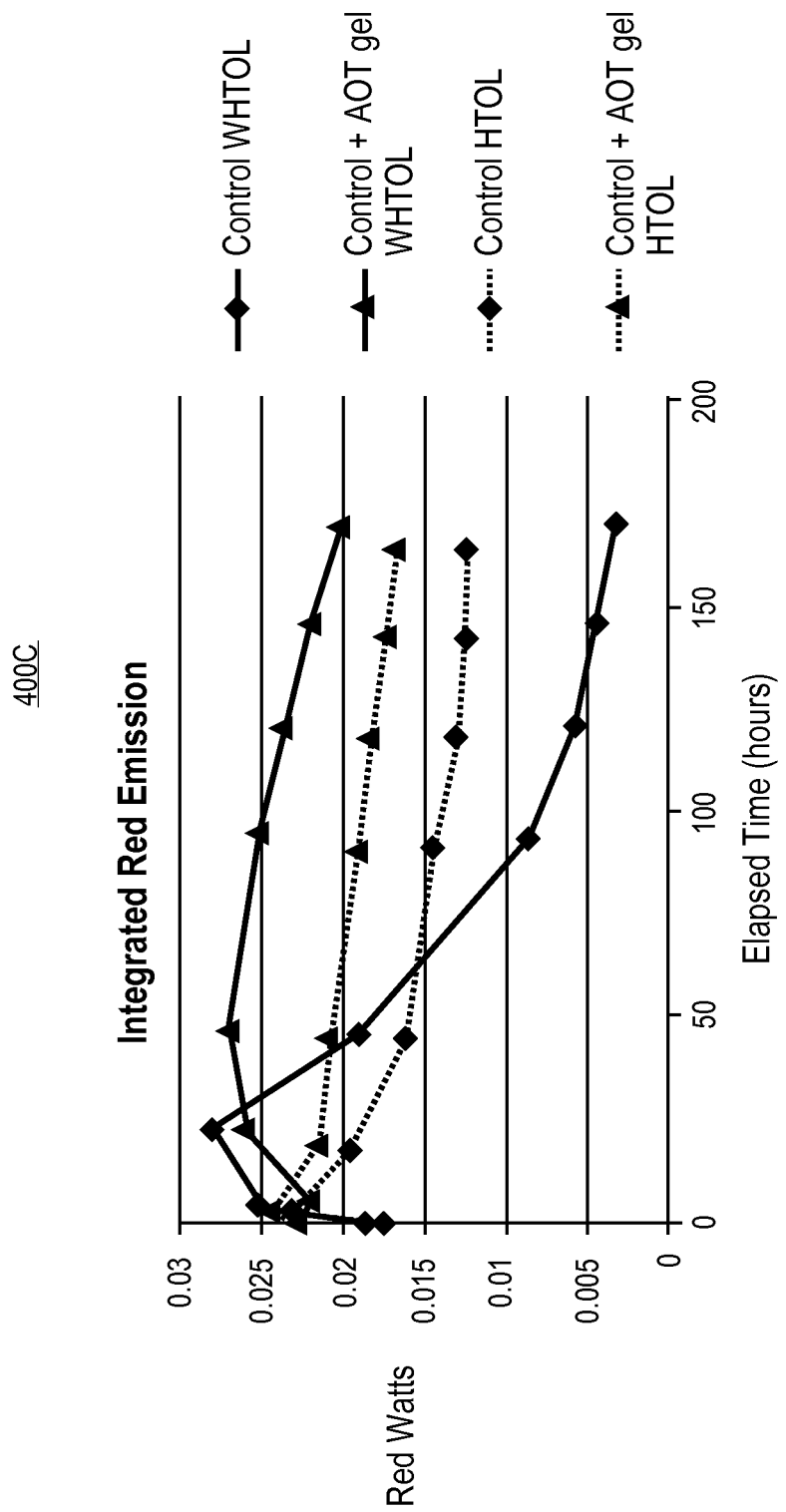
FIG. 4C is a graph demonstrating the improved performance of quantum dot/polymer composites in the presence of AOT gels, in accordance with an embodiment of the present invention.

In a sixth approach pertaining to embodiments involving the fabrication of quantum dot polymer composites for on-chip light emitting diode applications, a plurality of quantum dots is subjected to inclusion of additives to the quantum dot/polymer composite. In an exemplary embodiment, divinylperfluorohexane is added to the quantum dot/polymer composite. In another embodiment, a silica gel is synthesized by feeding tetramethyl orthosilicate (TMOS) or tetraethyl orthosilicate (TEOS) into water containing approximately 5% of a surfactant, dioctyl sodium sulfosuccinate, also known as AOT. In this way, a vast network of silica gels is formed (e.g., referred to as AOT gel). Adding AOT gel to quantum dot/polymer composites significantly improves the thermal stability and moisture resistance. Typically, the AOT gels are added after mixing quantum dot/polymer composites and base. However, no extra base is needed to compensate the addition of AOT gels. Alternatively, AOT gel may be added after pre-treatment of quantum dot/polymer composites with base. FIG. 4C is a graph 400C demonstrating the improved performance of quantum dot/polymer composites in the presence of AOT gels, in accordance with an embodiment of the present invention. Referring to graph 400C, not to be bound by theory, it is speculated that the AOT gel actually reinforces the quantum dot/polymer composites to slow down the degradation rate in hot and humid environment.

In an embodiment, the inclusion of other additives can be used to enhance optical performance of quantum dot composites (e.g., polymer matrix-based quantum dot compositions). For example, the addition of fumed silica to polymer formulations can greatly enhance the strength of the resulting film. Additionally, such fillers occupy interstitial matrix space, thus reducing moisture permeation and moisture retention. In one such embodiment, fillers such as fumed silica are added to a composition in order to reduce moisture ingress to the quantum dots. Furthermore, such fillers can act as physical spacers between individual quantum dots, reducing aggregation and reducing inter-particle energy transfer. Additionally, the addition of fillers that are highly scattering (i.e., non-absorbing and having a high index of refraction) can lead to further benefits for quantum dot materials.

It is to be appreciated that quantum dots differ from traditional phosphors in that they can exhibit multiexcitonic behavior. When traditional YAG phosphors absorb a photon, an electron is elevated into an excited state. After having absorbed a photon, YAG phosphors they will not absorb more light until they have relaxed back to the ground state.

As such, the phosphors become somewhat "transparent" while in the excited state. Quantum dots differ in that they can continue to absorb light while in the excited state. When excited, the resulting electron-hole pair is known as an exciton. Multiple excitons are called multiexcitons. The quantum yield of multiexcitions is in general greatly reduced compared to the single-exciton quantum yield, a result of Auger recombination. By having a highly scattering matrix, the excitation flux is more evenly distributed among all quantum dots in the sample. The flux that each quantum dot experiences is effectively reduced, minimizing multi-exciton events. In turn, this ensures that the quantum yield is as close as possible to the single exciton quantum yield and will suffer fewer losses due to Auger recombination. In accordance with an embodiment of the present invention, a scatterers such as a silica nanopowders, magnesium oxide (MgO), or zirconium oxide ($ZrO_2$) are included in a quantum do/polymer matrix composite to enhance the optical performance of the final material.

Figure 5:
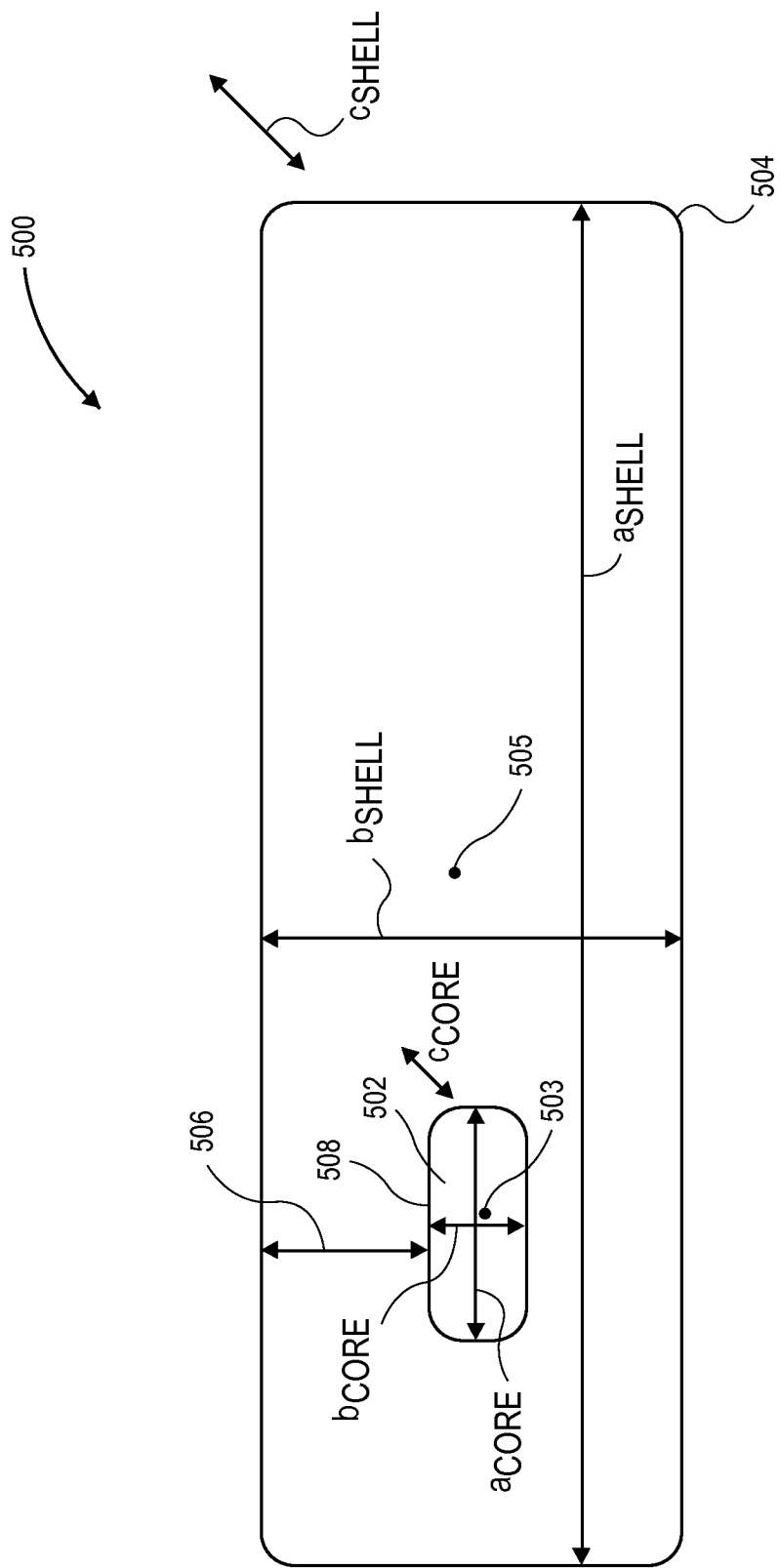
FIG. 5 illustrates a schematic of a cross-sectional view of a quantum dot suitable for dispersion in a polymer matrix, in accordance with an embodiment of the present invention.

In another aspect, the above polymer matrix compositions having a dispersion of nano-particles therein, as described above and in association with FIGS. 4A-4C, can include hetero-structure-based nano-particles, such as hetero-structure-based quantum dots. Such hetero-structures may have specific geometries suitable for performance optimization. In an example, several factors may be intertwined for establishing an optimized geometry for a quantum dot having a nano-crystalline core and nano-crystalline shell pairing. As a reference, FIG. 5 illustrates a schematic of a cross-sectional view of a quantum dot suitable for dispersion in a polymer matrix, in accordance with an embodiment of the present invention. Referring to FIG. 5, a semiconductor structure (e.g., a quantum dot structure) 500 includes a nano-crystalline core 502 surrounded by a nano-crystalline shell 504. The nano-crystalline core 502 has a length axis ($a_{CORE}$), a width axis ($b_{CORE}$) and a depth axis ($c_{CORE}$), the depth axis provided into and out of the plane shown in FIG. 5. Likewise, the nano-crystalline shell 504 has a length axis ($a_{SHELL}$), a width axis ($b_{SHELL}$) and a depth axis ($c_{SHELL}$), the depth axis provided into and out of the plane shown in FIG. 5. The nano-crystalline core 502 has a center 503 and the nano-crystalline shell 504 has a center 505. The nano-crystalline shell 504 surrounds the nano-crystalline core 502 in the b-axis direction by an amount 506, as is also depicted in FIG. 5.

The following are attributes of a quantum dot that may be tuned for optimization, with reference to the parameters provided in FIG. 5, in accordance with embodiments of the present invention. Nano-crystalline core 502 diameter (a, b or c) and aspect ratio (e.g., a/b) can be controlled for rough tuning for emission wavelength (a higher value for either providing increasingly red emission). A smaller overall nano-crystalline core provides a greater surface to volume ratio. The width of the nano-crystalline shell along 506 may be tuned for yield optimization and quantum confinement providing approaches to control red-shifting and mitigation of surface effects. However, strain considerations must be accounted for when optimizing the value of thickness 506. The length ($a_{SHELL}$) of the shell is tunable to provide longer radiative decay times as well as increased light absorption. The overall aspect ratio of the structure 500 (e.g., the greater of $a_{SHELL}/b_{SHELL}$ and $a_{SHELL}/c_{SHELL}$) may be tuned to directly impact PLQY. Meanwhile, overall surface/volume ratio for 500 may be kept relatively smaller to provide lower surface defects, provide higher photoluminescence, and limit self-absorption. Referring again to FIG. 5, the shell/core interface 508 may be tailored to avoid dislocations and strain sites. In one such embodiment, a high quality interface is obtained by tailoring one or more of injection temperature and mixing parameters, the use of surfactants, and control of the reactivity of precursors.

In accordance with an embodiment of the present invention, a high PLQY quantum dot is based on a core/shell pairing using an anisotropic core. With reference again to FIG. 5, an anisotropic core is a core having one of the axes $a_{CORE}$, $b_{CORE}$ or $c_{CORE}$ different from one or both of the remaining axes. An aspect ratio of such an anisotropic core is determined by the longest of the axes $a_{CORE}$, $b_{CORE}$ or $c_{CORE}$ divided by the shortest of the axes $a_{CORE}$, $b_{CORE}$ or $c_{CORE}$ to provide a number greater than 1 (an isotropic core has an aspect ratio of 1). It is to be understood that the outer surface of an anisotropic core may have rounded or curved edges (e.g., as in an ellipsoid) or may be faceted (e.g., as in a stretched or elongated tetragonal or hexagonal prism) to provide an aspect ratio of greater than 1 (note that a sphere, a tetragonal prism, and a hexagonal prism are all considered to have an aspect ratio of 1 in keeping with embodiments of the present invention).

A workable range of aspect ratio for an anisotropic nano-crystalline core for a quantum dot may be selected for maximization of PLQY. For example, a core essentially isotropic may not provide advantages for increasing PLQY, while a core with too great an aspect ratio (e.g., 2 or greater) may present challenges synthetically and geometrically when forming a surrounding shell. Furthermore, embedding the core in a shell composed of a material different than the core may also be used enhance PLQY of a resulting quantum dot.

Accordingly, in an embodiment, a semiconductor structure includes an anisotropic nano-crystalline core composed of a first semiconductor material and having an aspect ratio between, but not including, 1.0 and 2.0. The semiconductor structure also includes a nano-crystalline shell composed of a second, different, semiconductor material at least partially surrounding the anisotropic nano-crystalline core. In one such embodiment, the aspect ratio of the anisotropic nano-crystalline core is approximately in the range of 1.01-1.2 and, in a particular embodiment, is approximately in the range of 1.1-1.2. In the case of rounded edges, then, the nano-crystalline core may be substantially, but not perfectly, spherical. However, the nano-crystalline core may instead be faceted. In an embodiment, the anisotropic nano-crystalline core is disposed in an asymmetric orientation with respect to the nano-crystalline shell, as described in greater detail in the example below.

Another consideration for maximization of PLQY in a quantum dot structure is to provide an asymmetric orientation of the core within a surrounding shell. For example, referring again to FIG. 5, the center 503 of the core 502 may be misaligned with (e.g., have a different spatial point than) the center 505 of the shell 504. In an embodiment, a semiconductor structure includes an anisotropic nano-crystalline core composed of a first semiconductor material. The semiconductor structure also includes a nano-crystalline shell composed of a second, different, semiconductor material at least partially surrounding the anisotropic nano-crystalline core. The anisotropic nano-crystalline core is disposed in an asymmetric orientation with respect to the nano-crystalline shell. In one such embodiment, the nano-crystalline shell has a long axis (e.g., $a_{SHELL}$), and the anisotropic nano-crystalline core is disposed off-center along the long axis. In another such embodiment, the nano-crystalline shell has a short axis (e.g., $b_{SHELL}$), and the anisotropic nano-crystalline core is disposed off-center along the short axis. In yet another embodiment, however, the nano-crystalline shell has a long axis (e.g., $a_{SHELL}$) and a short axis (e.g., $b_{SHELL}$), and the anisotropic nano-crystalline core is disposed off-center along both the long and short axes.

With reference to the above described nano-crystalline core and nano-crystalline shell pairings, in an embodiment, the nano-crystalline shell completely surrounds the anisotropic nano-crystalline core. In an alternative embodiment, however, the nano-crystalline shell only partially surrounds the anisotropic nano-crystalline core, exposing a portion of the anisotropic nano-crystalline core, e.g., as in a tetrapod geometry or arrangement. In an embodiment, the nano-crystalline shell is an anisotropic nano-crystalline shell, such as a nano-rod, that surrounds the anisotropic nano-crystalline core at an interface between the anisotropic nano-crystalline shell and the anisotropic nano-crystalline core. The anisotropic nano-crystalline shell passivates or reduces trap states at the interface. The anisotropic nano-crystalline shell may also, or instead, deactivate trap states at the interface.

With reference again to the above described nano-crystalline core and nano-crystalline shell pairings, in an embodiment, the first and second semiconductor materials (core and shell, respectively) are each materials such as, but not limited to, Group II-VI materials (where the group II species could include species from Groups II (e.g., magnesium) or XII of the periodic table), Group III-V materials, Group IV-VI materials, Group I-III-VI materials, or Group II-IV-VI materials and, in one embodiment, are mono-crystalline. In one such embodiment, the first and second semiconductor materials are both Group II-VI materials, the first semiconductor material is cadmium selenide (CdSe), and the second semiconductor material is one such as, but not limited to, cadmium sulfide (CdS), zinc sulfide (ZnS), or zinc selenide (ZnSe). In an embodiment, the semiconductor structure further includes a nano-crystalline outer shell at least partially surrounding the nano-crystalline shell and, in one embodiment, the nano-crystalline outer shell completely surrounds the nano-crystalline shell. The nano-crystalline outer shell is composed of a third semiconductor material different from the first and second semiconductor materials. In a particular such embodiment, the first semiconductor material is cadmium selenide (CdSe), the second semiconductor material is cadmium sulfide (CdS), and the third semiconductor material is zinc sulfide (ZnS).

With reference again to the above described nano-crystalline core and nano-crystalline shell pairings, in an embodiment, the semiconductor structure (i.e., the core/shell pairing in total) has an aspect ratio approximately in the range of 1.5-10 and, 3-6 in a particular embodiment. In an embodiment, the nano-crystalline shell has a long axis and a short axis. The long axis has a length approximately in the range of 5-40 nanometers. The short axis has a length approximately in the range of 1-5 nanometers greater than a diameter of the anisotropic nano-crystalline core parallel with the short axis of the nano-crystalline shell. In a specific such embodiment, the anisotropic nano-crystalline core has a diameter approximately in the range of 2-5 nanometers. The thickness of the nano-crystalline shell on the anisotropic nano-crystalline core along a short axis of the nano-crystalline shell is approximately in the range of 1-5 nanometers of the second semiconductor material.

With reference again to the above described nano-crystalline core and nano-crystalline shell pairings, in an embodiment, the anisotropic nano-crystalline core and the nano-crystalline shell form a quantum dot. In one such embodiment, the quantum dot has a photoluminescence quantum yield (PLQY) of at least 90%. Emission from the quantum dot may be mostly, or entirely, from the nano-crystalline core. For example, in an embodiment, emission from the anisotropic nano-crystalline core is at least approximately 75% of the total emission from the quantum dot. An absorption spectrum and an emission spectrum of the quantum dot may be essentially non-overlapping. For example, in an embodiment, an absorbance ratio of the quantum dot based on absorbance at 400 nanometers versus absorbance at an exciton peak for the quantum dot is approximately in the range of 5-35.

In an embodiment, a quantum dot based on the above described nano-crystalline core and nano-crystalline shell pairings is a down-converting quantum dot. However, in an alternative embodiment, the quantum dot is an up-shifting quantum dot. In either case, a lighting apparatus may include a light emitting diode and a plurality of quantum dots such as those described above. The quantum dots may be applied proximal to the LED and provide down-shifting or up-shifting of light emitted from the LED. Thus, semiconductor structures according to the present invention may be advantageously used in solid state lighting. The visible spectrum includes light of different colors having wavelengths between about 380 nm and about 780 nm that are visible to the human eye. An LED will emit a UV or blue light which is down-converted (or up-shifted) by semiconductor structures described herein. Any suitable ratio of emission color from the semiconductor structures may be used in devices of the present invention. LED devices according to embodiments of the present invention may have incorporated therein sufficient quantity of semiconductor structures (e.g., quantum dots) described herein capable of down-converting any available blue light to red, green, yellow, orange, blue, indigo, violet or other color. These structures may also be used to downconvert or upconvert lower energy light (green, yellow, etc) from LED devices, as long as the excitation light produces emission from the structures.

The above described semiconductor structures, e.g., quantum dots, suitable for inclusion as a dispersion in a polymer matrix, as described above and in association with FIGS. 4A-4C, may be fabricated to further include one or more compositional transition layers between portions of the structures, e.g., between core and shell portions. Inclusion of such a transition layer may reduce or eliminate any performance inefficiency associated with otherwise abrupt junctions between the different portions of the structures. For example, the inclusion of a compositional transition layer may be used to suppress Auger recombination within a quantum dot structure. Auger recombination events translate to energy from one exciton being non-radiatively transferred to another charge carrier. Such recombination in quantum dots typically occurs on sub-nanosecond time scales such that a very short multi-exciton lifetime indicates non-radiative recombination, while higher nanosecond bi-exciton lifetimes indicate radiative recombination. A radiative bi-exciton has a lifetime approximately 2-4 times shorter than radiative single exciton.

More specifically, as is described in greater detail below in association with FIGS. 6-8, an optimal particle (e.g., quantum dot structure) may have one or more of a high aspect ratio, a large volume relative to other quantum dot hetero-structures, and graded or alloyed transitions between different semiconductor materials. The graded or alloyed transitions can be used to render a compositional and structural transition from one component (such as a quantum dot core) to another component (such as a quantum dot shell)

a smooth function rather than a step function. In one embodiment, the terms "graded," "gradient," or "grading" are used to convey gradual transitioning from one semiconductor to another. In one embodiment, the terms "alloy," "alloyed," or "alloying" are used to convey an entire volume having a fixed intermediate composition. In more specific embodiments, core or seed volume is maximized relative to shell volume for a given emission color. A graded or alloyed core/shell transition layer may be included between the two volumes.

Figure 6:
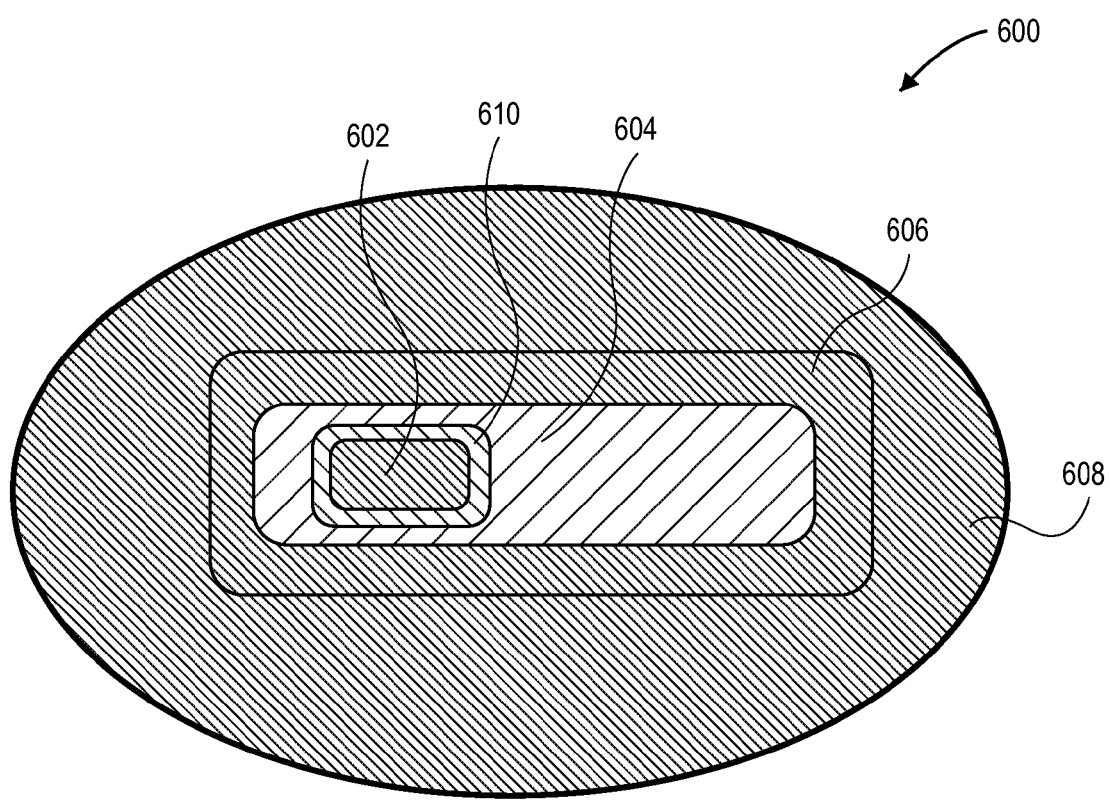
FIG. 6 illustrates a cross-sectional view of a semiconductor structure having a nano-crystalline core and nano-crystalline shell pairing with one compositional transition layer, in accordance with an embodiment of the present invention.

In a first example, FIG. 6 illustrates a cross-sectional view of a semiconductor structure having a nano-crystalline core and nano-crystalline shell pairing with one compositional transition layer, in accordance with an embodiment of the present invention.

Referring to FIG. 6, a semiconductor structure 600 includes a nano-crystalline core 602 composed of a first semiconductor material. A nano-crystalline shell 604 composed of a second, different, semiconductor material at least partially surrounds the nano-crystalline core 602. A compositional transition layer 610 is disposed between, and in contact with, the nano-crystalline core 602 and nano-crystalline shell 604. The compositional transition layer 610 has a composition intermediate to the first and second semiconductor materials.

In an embodiment, the compositional transition layer 610 is an alloyed layer composed of a mixture of the first and second semiconductor materials. In another embodiment, the compositional transition layer 610 is a graded layer composed of a compositional gradient of the first semiconductor material proximate to the nano-crystalline core 602 through to the second semiconductor material proximate to the nano-crystalline shell 604. In either case, in a specific embodiment, the compositional transition layer 610 has a thickness approximately in the range of 1.5-2 monolayers. Exemplary embodiments include a structure 600 where the first semiconductor material is cadmium selenide (CdSe), the second semiconductor material is cadmium sulfide (CdS), and the compositional transition layer 610 is composed of $CdSe_xS_y$, where $0<x<1$ and $0<y<1$, or where the first semiconductor material is cadmium selenide (CdSe), the second semiconductor material is zinc selenide (ZnSe), and the compositional transition layer 610 is composed of $Cd_xZn_ySe$, where $0<x<1$ and $0<y<1$.

In accordance with an embodiment of the present invention, the compositional transition layer 610 passivates or reduces trap states where the nano-crystalline shell 604 surrounds the nano-crystalline core 602. Exemplary embodiments of core and/or shell parameters include a structure 600 where the nano-crystalline core 602 is an anisotropic nano-crystalline core having an aspect ratio between, but not including, 1.0 and 2.0 (in a specific embodiment, approximately in the range of 1.01-1.2), and the nano-crystalline shell is an anisotropic nano-crystalline shell having an aspect ratio approximately in the range of 4-6.

In an embodiment, the nano-crystalline shell 604 completely surrounds the nano-crystalline core 602, as depicted in FIG. 6. In an alternative embodiment, however, the nano-crystalline shell 604 only partially surrounds the nano-crystalline core 602, exposing a portion of the nano-crystalline core 602. Furthermore, in either case, the nano-crystalline core 602 may be disposed in an asymmetric orientation with respect to the nano-crystalline shell 604. In one or more embodiments, semiconductor structures such as 600 are fabricated to further include a nano-crystalline outer shell 606 at least partially surrounding the nano-crystalline shell 604. The nano-crystalline outer shell 606 may be composed of a third semiconductor material different from the first and second semiconductor materials, i.e., different from the materials of the core 602 and shell 604. The nano-crystalline outer shell 606 may completely surround the nano-crystalline shell 604 or may only partially surround the nano-crystalline shell 604, exposing a portion of the nano-crystalline shell 604.

For embodiments including a nano-crystalline outer shell, an additional compositional transition layer may be included. Thus, in a second example, FIG. 7 illustrates a cross-sectional view of a semiconductor structure having a nano-crystalline core/nano-crystalline shell/nano-crystalline outer shell combination with two compositional transition layers, in accordance with an embodiment of the present invention.

Figure 7:
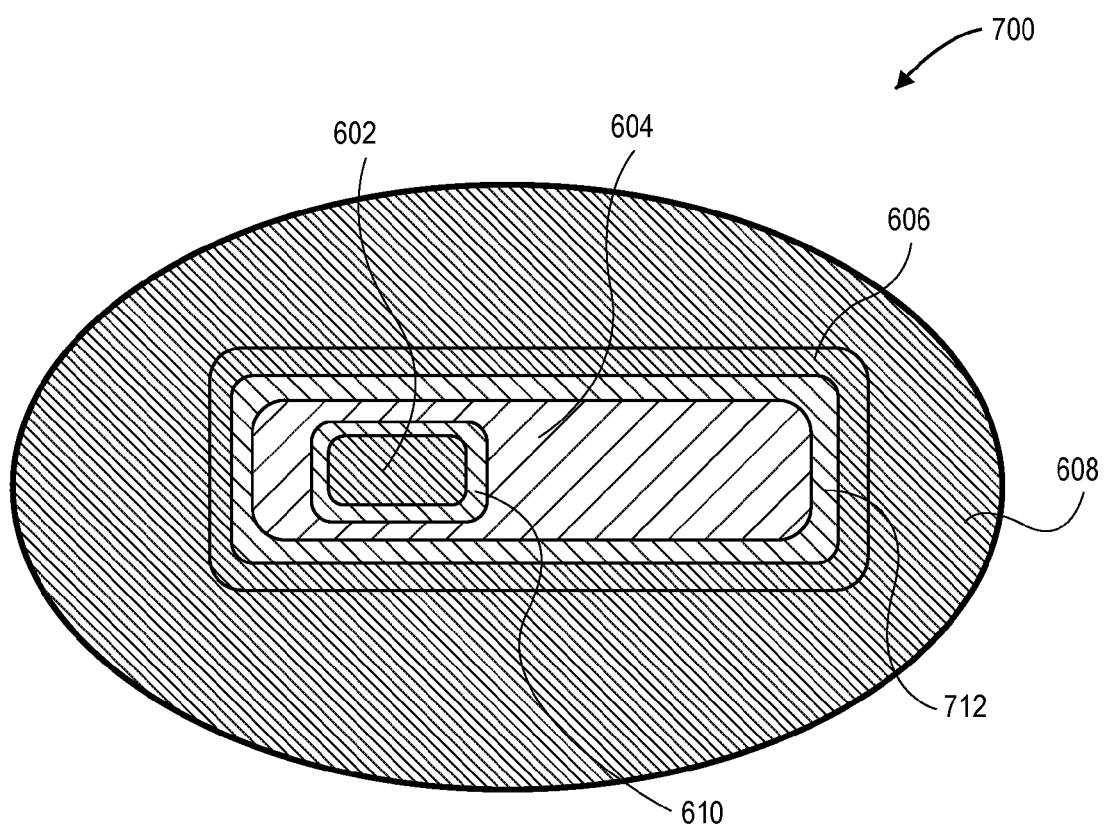
FIG. 7 illustrates a cross-sectional view of a semiconductor structure having a nano-crystalline core/nano-crystalline shell/nano-crystalline outer shell combination with two compositional transition layers, in accordance with an embodiment of the present invention.

Referring to FIG. 7, a semiconductor structure 700 includes the nano-crystalline core 602, nano-crystalline shell 604, nano-crystalline outer shell 606 and compositional transition layer 610 of structure 600. However, in addition, semiconductor structure 700 includes a second compositional transition layer 712 disposed between, and in contact with, the nano-crystalline shell 604 and the nano-crystalline outer shell 606. The second compositional transition layer 712 has a composition intermediate to the second and third semiconductor materials, i.e., intermediate to the semiconductor materials of the shell 604 and outer shell 606.

In an embodiment, the second compositional transition layer 712 is an alloyed layer composed of a mixture of the second and third semiconductor materials. In another embodiment, the second compositional transition layer 712 is a graded layer composed of a compositional gradient of the second semiconductor material proximate to the nano-crystalline shell 604 through to the third semiconductor material proximate to the nano-crystalline outer shell 606. In either case, in a specific embodiment, the second compositional transition layer 712 has a thickness approximately in the range of 1.5-2 monolayers. Exemplary embodiments include a structure 700 where the first semiconductor material is cadmium selenide (CdSe), the second semiconductor material is cadmium sulfide (CdS), the third semiconductor material is zinc sulfide (ZnS), and the second compositional transition layer 1412 is composed of $Cd_xZn_yS$, where $0<x<1$ and $0<y<1$, or the first semiconductor material is cadmium selenide (CdSe), the second semiconductor material is zinc selenide (ZnSe), the third semiconductor material is zinc sulfide (ZnS), and the second compositional transition layer 1412 is composed of $ZnSe_xS_y$, where $0<x<1$ and $0<y<1$. In accordance with an embodiment of the present invention, the second compositional transition layer 712 passivates or reduces trap states where the nano-crystalline outer shell 606 surrounds the nano-crystalline shell 604.

For other embodiments including a nano-crystalline outer shell, an outer compositional transition layer may be included without including an inner compositional transition layer. Thus, in a third example, FIG. 8 illustrates a cross-sectional view of a semiconductor structure having a nano-crystalline core/nano-crystalline shell/nano-crystalline outer shell combination with one compositional transition layer, in accordance with an embodiment of the present invention.

Figure 8:
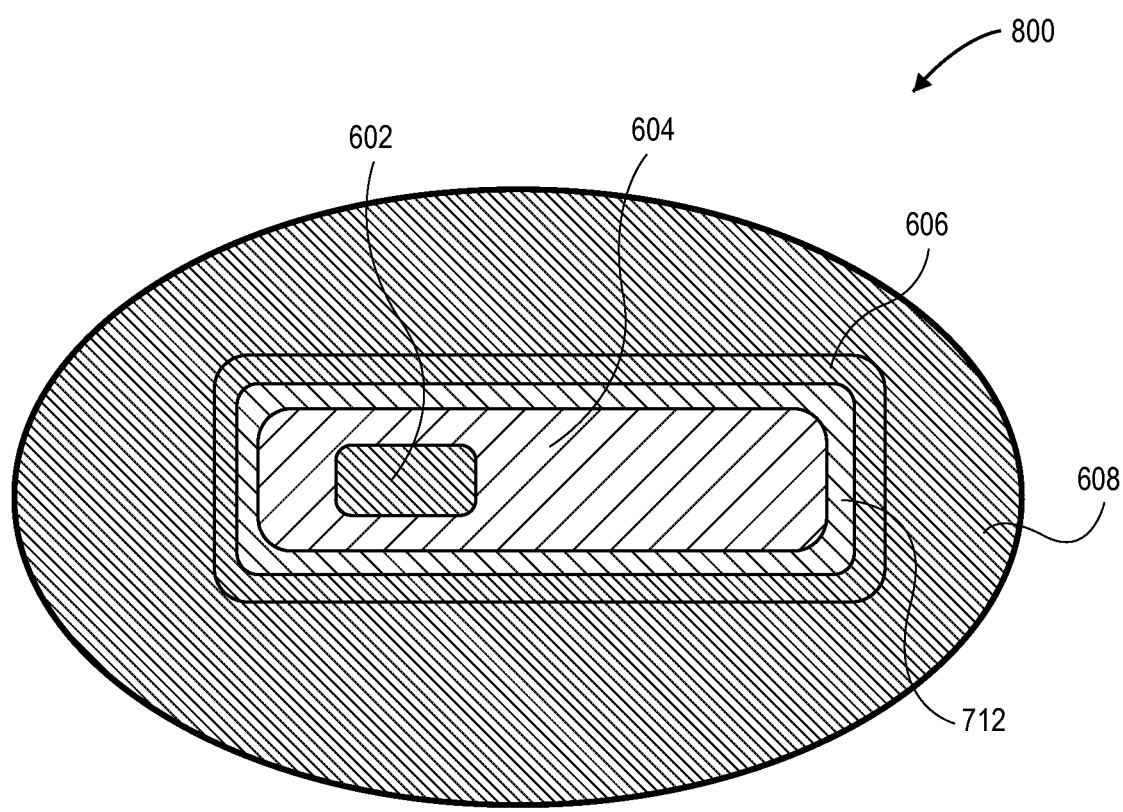
FIG. 8 illustrates a cross-sectional view of a semiconductor structure having a nano-crystalline core/nano-crystalline shell/nano-crystalline outer shell combination with one compositional transition layer, in accordance with an embodiment of the present invention.

Referring to FIG. 8, a semiconductor structure 800 includes the nano-crystalline core 602, nano-crystalline shell 604, and nano-crystalline outer shell 606 of structure 600. In addition, the semiconductor structure 800 includes the compositional transition layer 712 of structure 700 disposed between, and in contact with, the nano-crystalline shell 604 and the nano-crystalline outer shell 606. However, structure 800 does not include the compositional transition layer 610 of structure 600, i.e., there is no compositional transition layer between the core 602 and shell 604.

Referring to FIGS. 5-8, and as depicted in FIGS. 6-8, the structures 500, 600, 700 and 800 may further include an insulator coating (e.g., shown as 608 in FIGS. 6-8) surrounding and encapsulating the nano-crystalline core/nano-crystalline shell pairing or nano-crystalline core/nano-crystalline shell/nano-crystalline outer shell combination. In one such embodiment, the insulator coating is composed of an amorphous material such as, but not limited to, silica ($SiO_x$), titanium oxide ($TiO_x$), zirconium oxide ($ZrO_x$), alumina ($AlO_x$), or hafnia ($HfO_x$). In an embodiment, insulator-coated structures based on structures 500, 600, 700 and 800 are quantum dot structures. For example, structures 500, 600, 700 and 800 may be used as a down-converting quantum dot or an up-shifting quantum dot.

Figure 9:
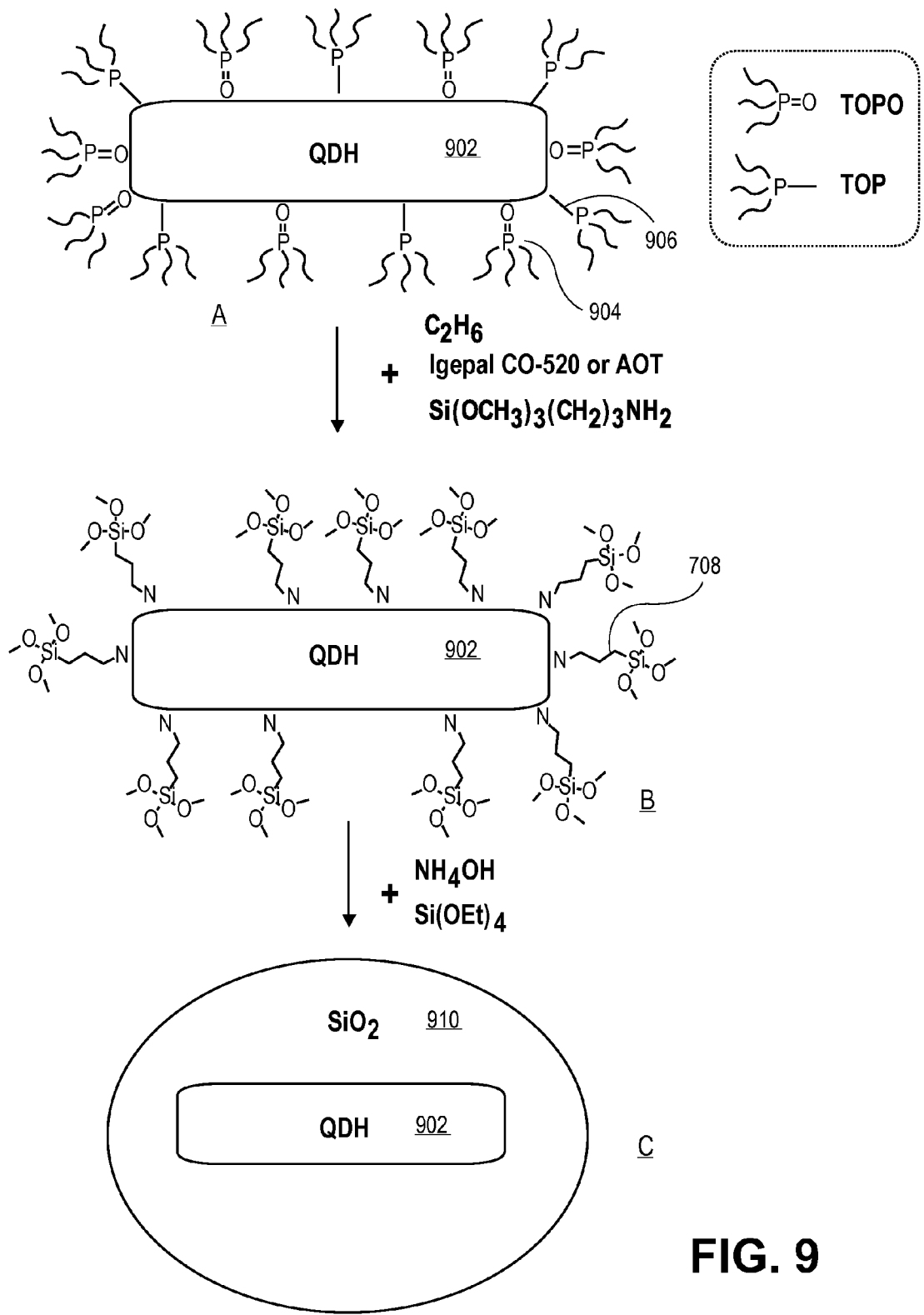
FIG. 9 illustrates operations in a reverse micelle approach to coating a semiconductor structure, in accordance with an embodiment of the present invention.

The above described insulator coating may be formed to encapsulate a quantum dot using a reverse micelle process. For example, FIG. 9 illustrates operations in a reverse micelle approach to coating a semiconductor structure, in accordance with an embodiment of the present invention. Referring to part A of FIG. 9, a quantum dot hetero-structure (QDH) 902 (e.g., a nano-crystalline core/shell pairing) has attached thereto a plurality of TOPO ligands 904 and TOP ligands 906. Referring to part B, the plurality of TOPO ligands 904 and TOP ligands 906 are exchanged with a plurality of $Si(OCH_3)_3(CH_2)_3NH_2$ ligands 908. The structure of part B is then reacted with TEOS ($Si(OEt)_4$) and ammonium hydroxide ($NH_4OH$) to form a silica coating 910 surrounding the QDH 902, as depicted in part C of FIG. 9.

In another aspect, a polymer matrix composition, such as compositions described above and in association with FIGS. 4A-4C, is applied to a lighting device to provide a layer having a dispersion of semiconductor structures therein for inclusion in the lighting device. In one embodiment, the dispersion of semiconductor structures is a dispersion of quantum dots such as those described above in association with FIGS. 5-8.

In a first exemplary embodiment, a method of applying a light-conversion layer to a surface of a light-emitting diode (LED) includes first, separately, forming a polymer matrix from a mixture of quantum dots. The resulting polymer matrix includes a dispersion of the quantum dots therein and is then applied to the surface of the LED. In one such embodiment, applying the polymer matrix to the surface of the LED involves using a technique such as, but not limited to, spraying, dip-coating, spin-coating, or drop-casting. The polymer matrix can be cured with ultra-violet (UV) light exposure or heating, in one embodiment. It is to be appreciated that the polymer matrix having the dispersion of quantum dots therein can be applied to discrete LED devices or, in another embodiment, prior to dicing the LEDs from a wafer having a plurality of LED dies. In the latter case, application of the polymer matrix or matrix can involve uniform distribution across the wafer prior to dicing the wafer.

Figure 10:
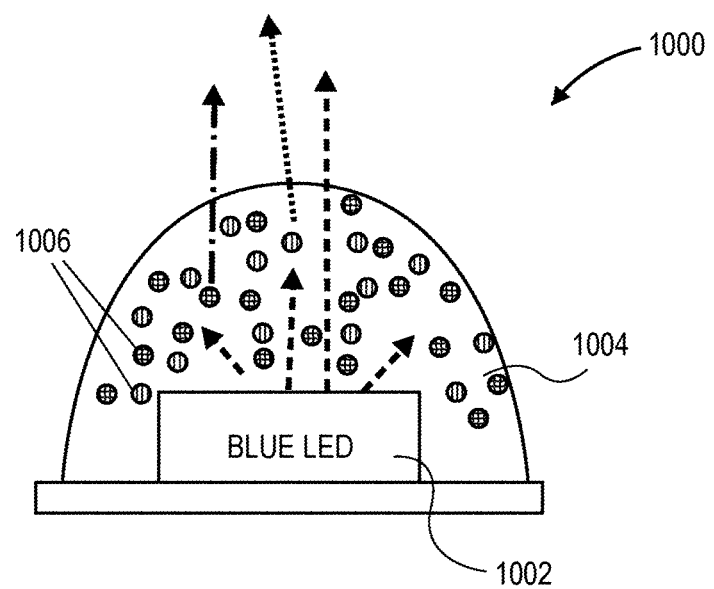
FIG. 10 illustrates a lighting device that includes a blue LED with a layer having a polymer matrix with a dispersion of quantum dots therein, in accordance with an embodiment of the present invention.

With respect to illustrating the above concepts in a resulting device configuration, FIG. 10 illustrates a lighting device 1000. Device 1000 has a blue LED 1002 with a polymer matrix layer 1004 having a dispersion of quantum dots 1006 therein, in accordance with an embodiment of the present invention. Devices 1000 may be used to produce "cold" or "warm" white light. In one embodiment, the device 1000 has little to no wasted energy since there is little to no emission in the IR regime. In a specific such embodiment, the use of a polymer matrix layer having a composition with a dispersion of anisotropic quantum dots therein enables greater than approximately 40% lm/W gains versus the use of conventional phosphors. Increased efficacy may thus be achieved, meaning increased luminous efficacy based on lumens (perceived light brightness) per watt electrical power. Accordingly, down converter efficiency and spectral overlap may be improved with the use of a dispersion of quantum dots to achieve efficiency gains in lighting and display. In an additional embodiment, a conventional phosphor is also included in the polymer matrix composition, along with the dispersion of quantum dots 1006.

Figure 11:
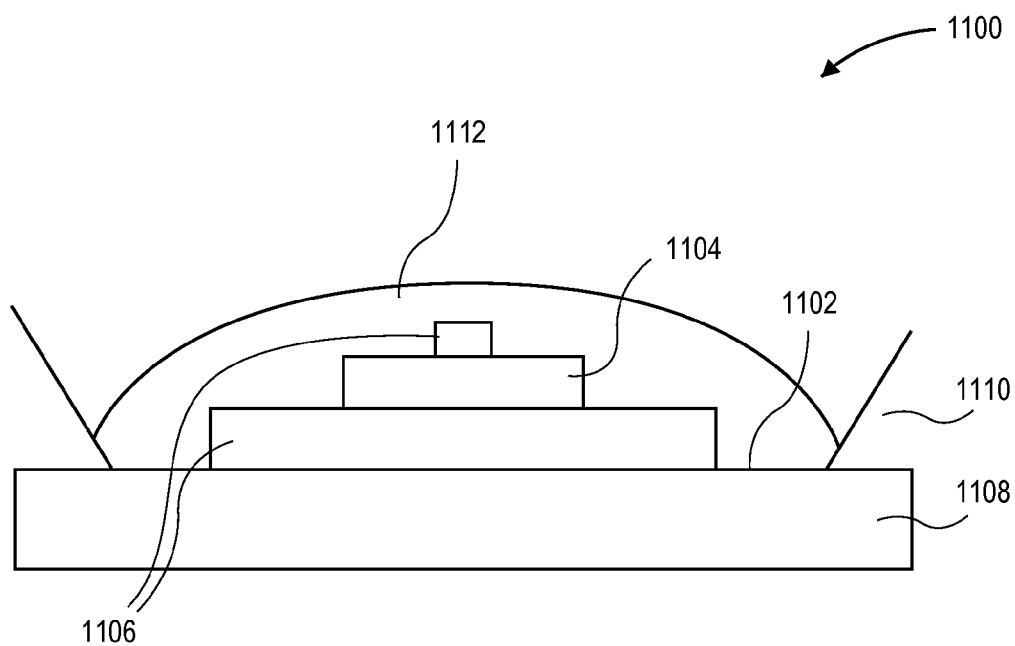
FIG. 11 illustrates a cross-sectional view of a lighting device with a layer having a polymer matrix with a disper

Different approaches may be used to provide a quantum dot layer in a lighting device. In an example, FIG. 11 illustrates a cross-sectional view of a lighting device 1100 with a layer having a polymer matrix composition with a dispersion of quantum dots therein, in accordance with an embodiment of the present invention. Referring to FIG. 11, a blue LED structure 1102 includes a die 1104, such as an InGaN die, and electrodes 1106. The blue LED structure 1102 is disposed on a coating or supporting surface 1108 and housed within a protective and/or reflective structure 1110. A polymer matrix layer 1112 is formed over the blue LED structure 1102 and within the protective and/or reflective structure 1110. The polymer matrix layer 1112 has a composition including a dispersion of quantum dots or a combination of a dispersion of quantum dots and conventional phosphors. Although not depicted, the protective and/or reflective structure 1110 can be extended upwards, well above the matrix layer 1112, to provide a "cup" configuration.

Figure 12:
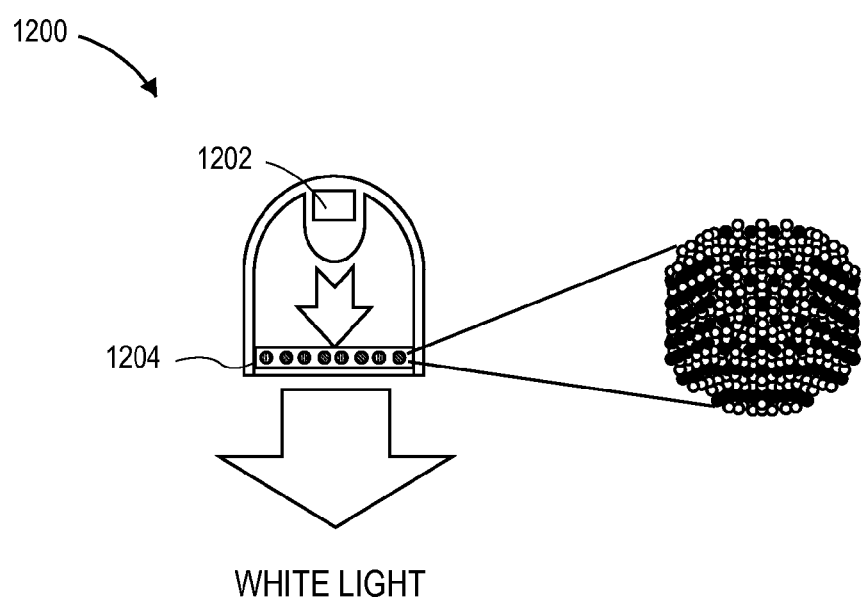
- FIG. 12 illustrates a cross-sectional view of a lighting device with a layer having a polymer matrix with a dispersion of quantum dots therein, in accordance with another embodiment of the present invention.

Although described herein as applicable for on-chip applications, polymer matrix compositions as described above and in association with FIGS. 4A-4C may also be used as remote layers. In an example, FIG. 12 illustrates a cross-sectional view of a lighting device 1200 with a polymer matrix layer having a composition with a dispersion of quantum dots therein, in accordance with another embodiment of the present invention. Referring to FIG. 12, the lighting device 1200 includes a blue LED structure 1202. A quantum dot down converter screen 1204 is positioned somewhat remotely from the blue LED structure 1202. The quantum dot down converter screen 1204 includes a polymer matrix layer with a composition having a dispersion of quantum dots therein, e.g., of varying color, or a combination of a dispersion of quantum dots and conventional phosphors. In one embodiment, the device 1200 can be used to generate white light, as depicted in FIG. 12.

Figure 13:
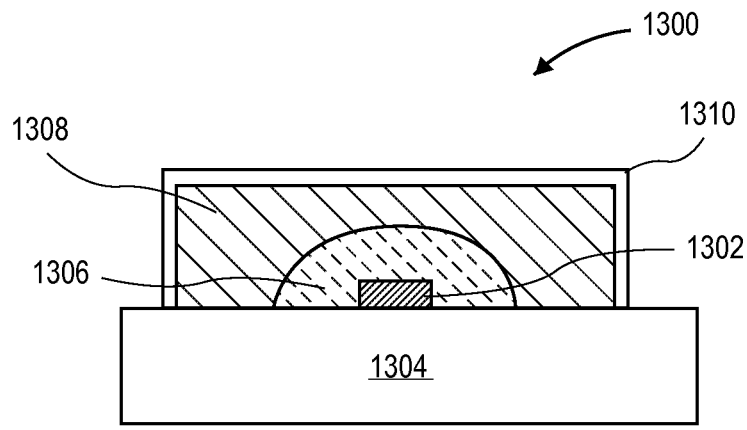
FIG. 13 illustrates a cross-sectional view of a lighting device with a layer having a polymer matrix with a dispersion of quantum dots therein, in accordance with another embodiment of the present invention.

In another example, FIG. 13 illustrates a cross-sectional view of a lighting device 1300 with a layer having a polymer matrix composition with a dispersion of quantum dots therein, in accordance with another embodiment of the present invention. Referring to FIG. 13, the lighting device 1300 includes a blue LED structure 1302 supported on a substrate 1304 which may house a portion of the electrical components of the blue LED structure 1302. A first conversion layer 1306 has a polymer matrix composition that includes a dispersion of red-light emitting anisotropic quantum dots therein. A second conversion layer 1308 has a second polymer matrix composition that includes a dispersion of quantum dots or green or yellow phosphors or a combination thereof (e.g., yttrium aluminum garnet, YAG phosphors) therein. Optionally, a sealing layer 1310 may be formed over the second conversion layer 1308, as depicted in FIG. 13. In one embodiment, the device 1300 can be used to generate white light.

Figure 14:
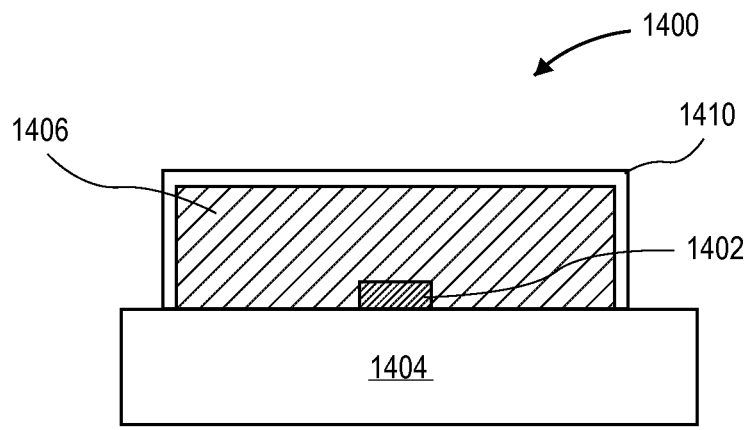
FIG. 14 illustrates a cross-sectional view of a lighting device with a layer having a polymer matrix with a dispersion of quantum dots therein, in accordance with another embodiment of the present invention.

In another example, FIG. 14 illustrates a cross-sectional view of a lighting device 1400 with a layer having a polymer matrix composition with a dispersion of quantum dots therein, in accordance with another embodiment of the present invention. Referring to FIG. 14, the lighting device 1400 includes a blue LED structure 1402 supported on a substrate 1404 which may house a portion of the electrical components of the blue LED structure 1402. A single conversion layer 1406 has a polymer matrix composition that includes a dispersion of red-light emitting anisotropic quantum dots in combination with a dispersion of green quantum dots or green and/or yellow phosphors therein. Optionally, a sealing layer 1410 may be formed over the single conversion layer 1406, as depicted in FIG. 14. In one embodiment, the device 1400 can be used to generate white light.

Figure 15A:
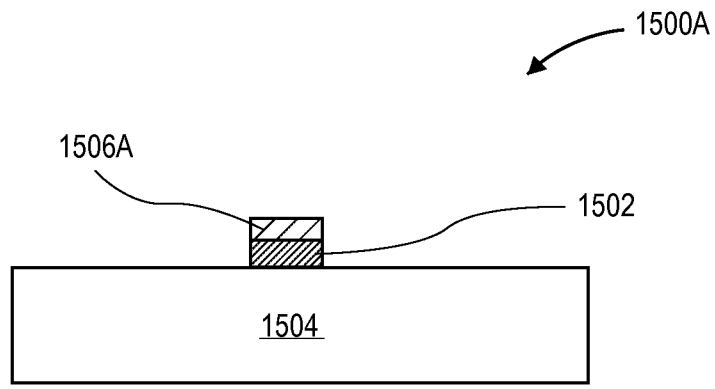
FIGS. 15A-15C illustrate cross-sectional views of various configurations for lighting devices with a layer having a polymer matrix with a dispersion of quantum dots therein, in accordance with another embodiment of the present invention.
Figure 15B:
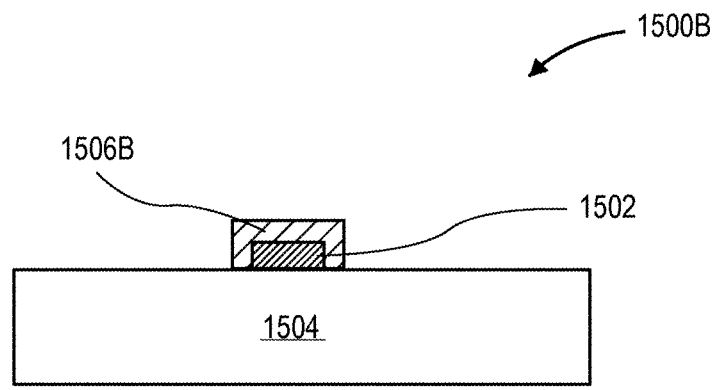
Figure 15C:
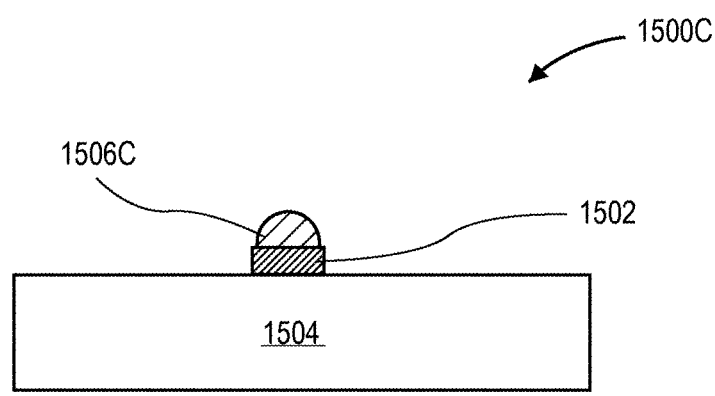

In additional examples, FIGS. 15A-15C illustrate cross-sectional views of various configurations for lighting devices 1500A-1500C with a layer having a polymer matrix composition with a dispersion of quantum dots therein, respectively, in accordance with another embodiment of the present invention. Referring to FIGS. 15A-15C, the lighting devices 1500A-1500C each include a blue LED structure 1502 supported on a substrate 1504 which may house a portion of the electrical components of the blue LED structure 1502. A conversion layer 1506A-1506C, respectively, has a polymer matrix composition that includes a dispersion of one or more light-emitting color types of quantum dots therein. Referring to FIG. 1500A specifically, the conversion layer 1506A is disposed as a thin layer only on the top surface of the blue LED structure 1502. Referring to FIG. 1500B specifically, the conversion layer 1506B is disposed as a thin layer conformal with all exposed surfaces of the blue LED structure 1502. Referring to FIG. 1500C specifically, the conversion layer 1506C is disposed as a "bulb" only on the top surface of the blue LED structure 1502. In the above examples (e.g., FIGS. 10-14 and 15A-15C), although use with a blue LED is emphasized, it is to be understood that a layer having a composition with a dispersion of quantum dots therein can be used with other light sources as well, including LEDs other than blue LEDs.

Thus, quantum dot polymer composites for on-chip light emitting diode applications have been disclosed.

EXPERIMENTAL SECTION

Experiment 1 (Pre-Treat)

800 µl of shells are added to a vial (the storage solvent is toluene). 1200 µl of additional toluene is added. 480 µl 2M LiOH in methanol is added. The sample is mixed thoroughly by vortex or similar manner. The sample is sonicated. The sample is centrifuged, and the solvent is decanted. 2 mL of toluene is added followed by mixing steps (vortex and sonication). The sample is centrifuged, and the solvent is decanted. 2 mL of toluene is added followed by mixing steps (vortex and sonication). The sample is centrifuged, and the solvent is decanted. 2 grams of a two-part polymer are added (1.6 g OE 6630 B+0.4 g OE 6630 A). The sample is mixed. The composite is dispensed and cured at 150° C. for two hours.

Experiment 2 (Leave-in)

800 µl of shells are added to a vial (the storage solvent is toluene). The sample is centrifuged, and the solvent is decanted. 2 grams of a two-part polymer are added (1.6 g OE 6630 B+0.4 g OE 6630 A). 120 µl of 2M LiOH in methanol is added. The sample is mixed. The composite is dispensed and cured at 150° C. for two hours.

Experiment 3 (Base Pre-Treatment Protocol)

Add 50 mg silica nanopowder to a glass vial. Add 800 µl of shells to the vial. Mix briefly (vortex). Spin, decant solvent (8 ml vials=>4 k rpm, 5 min; 20 ml vials=3 k rpm 7-10 min). Add 2 mL Octadecene (ODE). Mix briefly (vortex, sonicate). Add 700 µl Lithium Hydroxide. Vortex, sonicate 30 min, vortexing occasionally. Spin, decant. Add 2 mL ODE. Mix briefly (vortex, sonicate). Add 700 µl Methanol. Vortex, sonicate 5 min, vortexing occasionally. Spin, decant. Add 2 mL ODE. Mix briefly (vortex, sonicate). Add 700 µl Methanol. Vortex, sonicate 5 min, vortexing occasionally. Spin, decant. Add 2 mL ODE. Heat 150° C. for 1 hr. Spin, decant. Add 2 mL cyclohexane. Vortex, sonicate 5 min, vortexing occasionally. Spin, decant. Add 2 mL cyclohexane. Vortex, sonicate 5 min, vortexing occasionally. Spin, decant. Heat+vac 65° C. overnight. Scrape vials into pre-weighed SM cup. Weigh powder to determine amount of polymer to add (72.4 mg powder=>2.0 grams polymer).

What is claimed is:

1. A composite for on-chip light emitting diode application, the composite comprising:
    a polymer matrix;
    a plurality of quantum dots dispersed in the polymer matrix; and
    a base chemical compound dispersed in the polymer matrix, wherein the base chemical compound is selected from a group of base chemical compounds consisting of lithium hydroxide (LiOH), potassium hydroxide (KOH), sodium hydroxide (NaOH), rubidium hydroxide (RbOH), cesium hydroxide (CsOH), magnesium hydroxide ($Mg(OH)_2$), calcium hydroxide ($Ca(OH)_2$) strontium hydroxide ($Sr(OH)_2$), barium hydroxide ($Ba(OH)_2$), tetramethylammonium hydroxide (($Me)_4NOH$), tetraethylammonium hydroxide (($Et)_4NOH$), tetrabutylammonium hydroxide (($Bu)_4$ NOH)), lithium diisopropyl amide (LDA), sodium bis(trimethylsilyl)amide (sodium HMDS), potassium bis(trimethylsilyl)amide (potassium HMDS), and combinations thereof.

2. The composite of claim 1, wherein the polymer matrix comprises a silicone material.

3. The composite of claim 1, wherein each of the plurality of quantum dots is immobilized and separated from one another within the polymer matrix.

4. The composite of claim 1, wherein each of the plurality of quantum dots is coated with an insulator coating.

5. The composite of claim 1, further comprising:
    a plurality of light-scattering nanoparticles different from the plurality of quantum dots.

6. The composite of claim 5, wherein the plurality of light-scattering nanoparticles comprises a material selected from the group consisting of silica and magnesium oxide.

7. The composite of claim 1, further comprising:
    fumed silica dispersed in the polymer matrix.

8. The composite of claim 1, further comprising:
    dioctyl sodium sulfuccinate dispersed in the polymer matrix.

9. A light emitting diode chip comprising a layer of the composite of claim 1 disposed thereon.

10. A composite for on-chip light emitting diode application, the composite comprising:
- a polymer matrix;
- a plurality of quantum dots dispersed in the polymer matrix;
- a base chemical compound dispersed in the polymer matrix; and
- dioctyl sodium sulfuccinate dispersed in the polymer matrix.

* * * * *